(12) United States Patent
Hanakawa et al.

(10) Patent No.: US 7,092,050 B2
(45) Date of Patent: Aug. 15, 2006

(54) LIQUID CRYSTAL DEVICE, MANUFACTURING METHOD THEREFOR, AND ELECTRONIC APPARATUS

(75) Inventors: Manabu Hanakawa, Matsumoto (JP); Shoji Hinata, Matsumoto (JP)

(73) Assignee: Seiko Epson Corporation, (JP)

( * ) Notice: Subject to any disclaimer, the term of this patent is extended or adjusted under 35 U.S.C. 154(b) by 110 days.

(21) Appl. No.: 10/846,870

(22) Filed: May 14, 2004

(65) Prior Publication Data

US 2004/0212772 A1  Oct. 28, 2004

Related U.S. Application Data

(62) Division of application No. 09/865,186, filed on May 24, 2001, now Pat. No. 6,768,533.

(30) Foreign Application Priority Data

| May 25, 2000 | (JP) | 2000-154695 |
| May 25, 2000 | (JP) | 2000-154696 |
| Apr. 2, 2001 | (JP) | 2001-103495 |

(51) Int. Cl.
*G02F 1/1333* (2006.01)

(52) U.S. Cl. .................................... 349/111
(58) Field of Classification Search ................. 349/44, 349/111
See application file for complete search history.

(56) References Cited

U.S. PATENT DOCUMENTS

| 4,853,296 A | * | 8/1989 | Fukuyoshi | .................. 428/623 |
| 5,162,933 A | * | 11/1992 | Kakuda et al. | .................. 349/46 |
| 5,365,357 A | * | 11/1994 | Ohgawara et al. | ........... 349/111 |
| 5,400,157 A | * | 3/1995 | Won | ........................ 349/152 |
| 5,420,708 A | * | 5/1995 | Yokoyama et al. | .......... 349/149 |
| 5,556,670 A | | 9/1996 | Mihara et al. | |
| 5,671,027 A | | 9/1997 | Sasano et al. | |
| 5,968,850 A | | 10/1999 | Jeong et al. | |
| 6,204,897 B1 | * | 3/2001 | Colgan et al. | .................. 349/12 |
| 6,219,124 B1 | | 4/2001 | Lee et al. | |
| 6,259,495 B1 | | 7/2001 | Maeda | |

(Continued)

FOREIGN PATENT DOCUMENTS

JP        02-245735        10/1990

(Continued)

OTHER PUBLICATIONS

Korean Examination Results.

(Continued)

*Primary Examiner*—James A. Dudek
(74) *Attorney, Agent, or Firm*—Harness, Dickey & Pierce, P.L.C.

(57) ABSTRACT

The liquid crystal display device has a structure having substrates 200 and 300 adhered to each other by a sealing material 110 with a predetermined gap therebetween and having liquid crystal 160 enclosed in the gap. On an opposing surface of the substrate 200, transparent electrodes 214 are formed, and on an opposing surface of the substrate 300, segment electrodes 314 are formed. The common electrodes 214 are connected to wiring 350 formed on the substrate 300 via conductive particles 114 mixed in the sealing material 110, and the wiring 350 are each a laminated film of a transparent conductive film 354 composed of the same conductive layer as that of the segment electrode 314 and a low-resistance conductive film 352 composed of a low-resistance material, such as chromium, having a resistance lower than that of the transparent conductive film 354. However, the low-resistance conductive film 352 is formed at an area other than the portion connecting with the conductive particles 114.

2 Claims, 26 Drawing Sheets

U.S. PATENT DOCUMENTS

| | | | |
|---|---|---|---|
| 6,433,841 B1 * | 8/2002 | Murade et al. | 349/43 |
| 6,433,842 B1 * | 8/2002 | Kaneko et al. | 349/43 |

FOREIGN PATENT DOCUMENTS

| | | |
|---|---|---|
| JP | 03-144421 | 6/1991 |
| JP | 04-037146 | 2/1992 |
| JP | 04-166916 | 6/1992 |
| JP | 04-217229 | 8/1992 |
| JP | 05-224225 | 9/1993 |
| JP | 06-222372 | 8/1994 |
| JP | 06-289413 | 10/1994 |
| JP | 09-26589 | 1/1997 |
| JP | 09-152623 | 6/1997 |
| KR | 10-0188110 | 6/1999 |

OTHER PUBLICATIONS

Examination Results of corresponding Japanese Application No. 2001-103495.

Communication from Taiwan Patent Office regarding counterpart application.

* cited by examiner

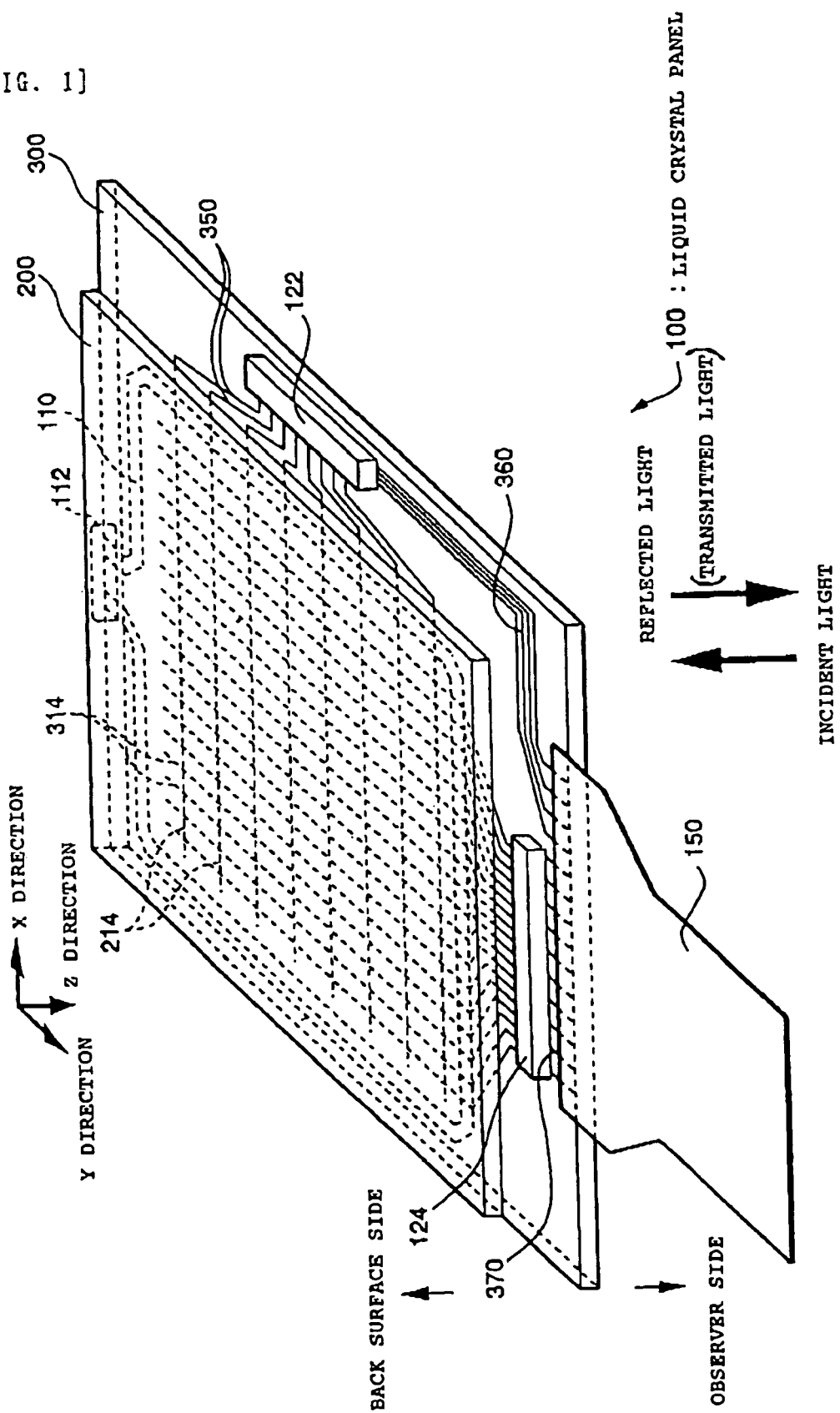

[FIG. 2]
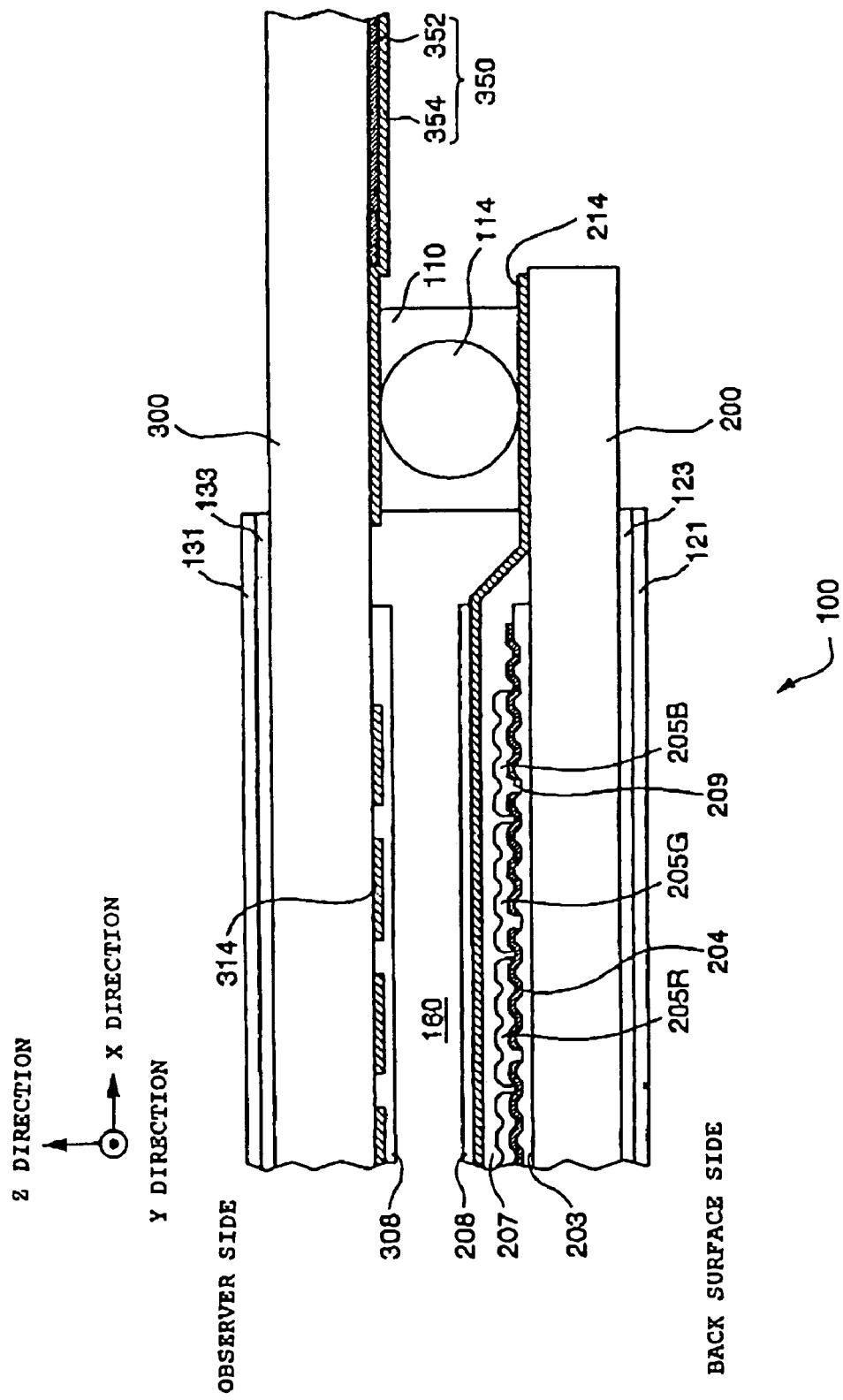

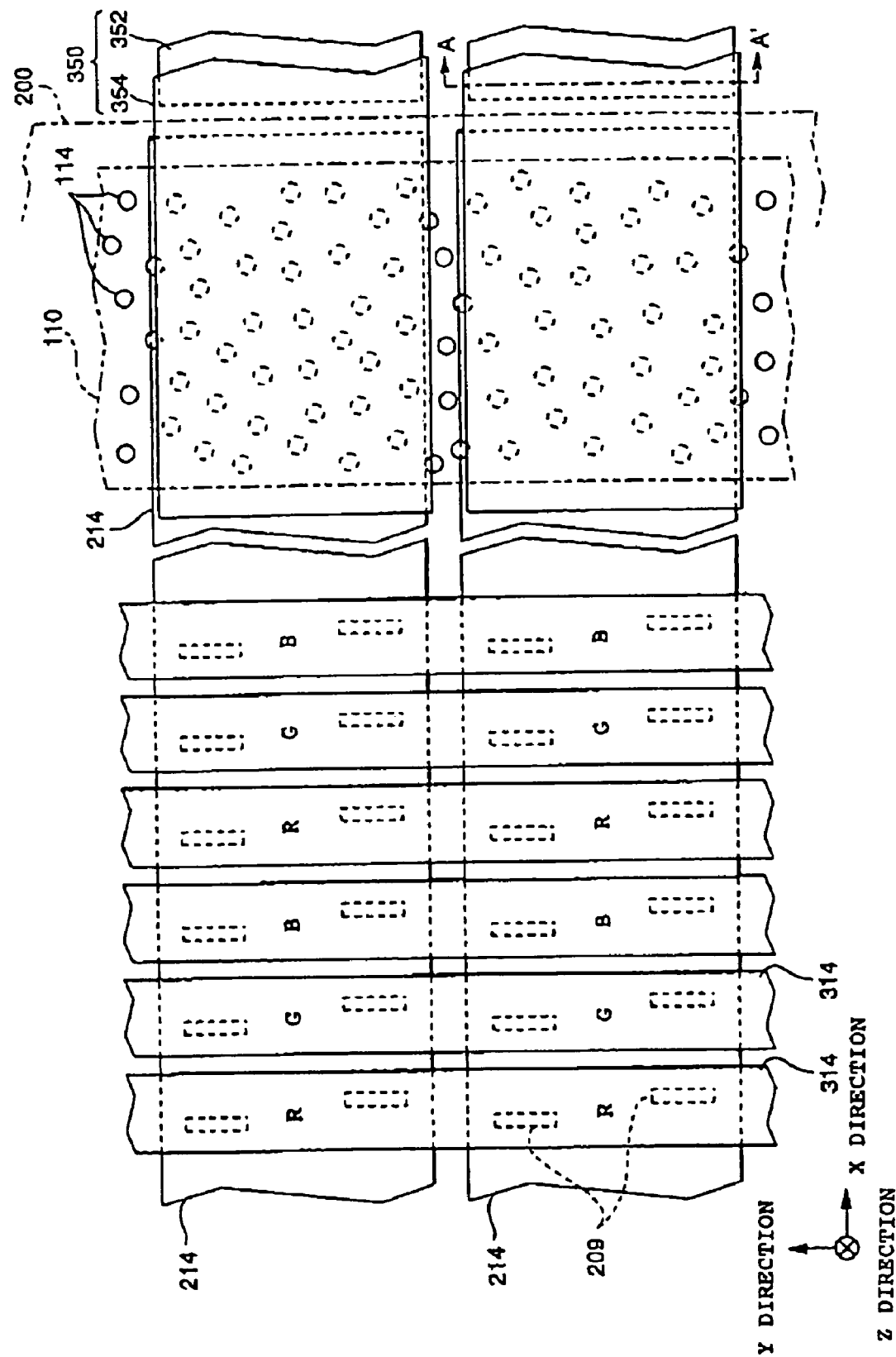
[FIG. 3]

[FIG. 4]
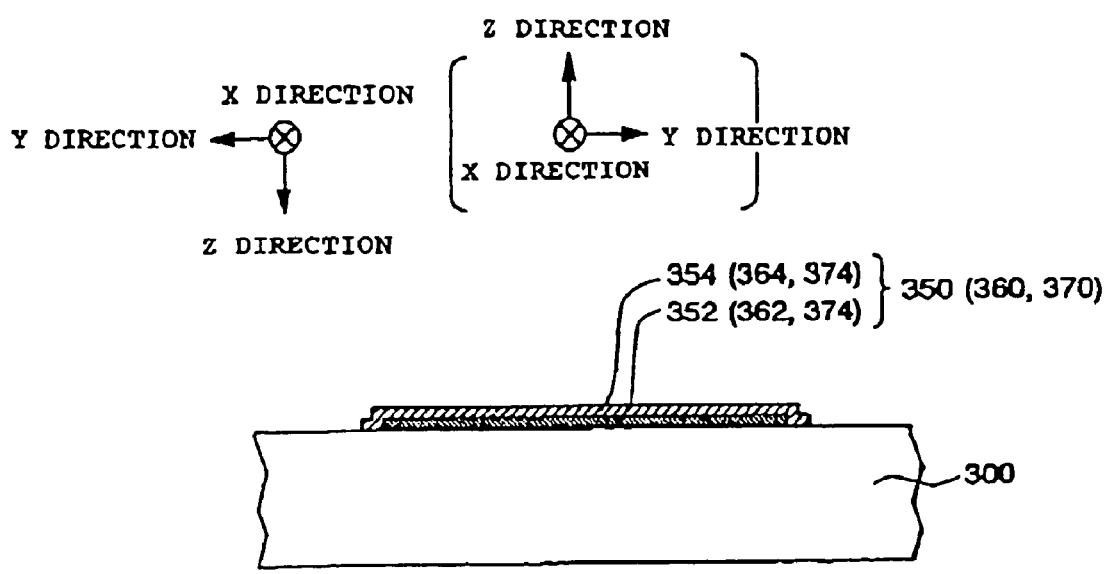

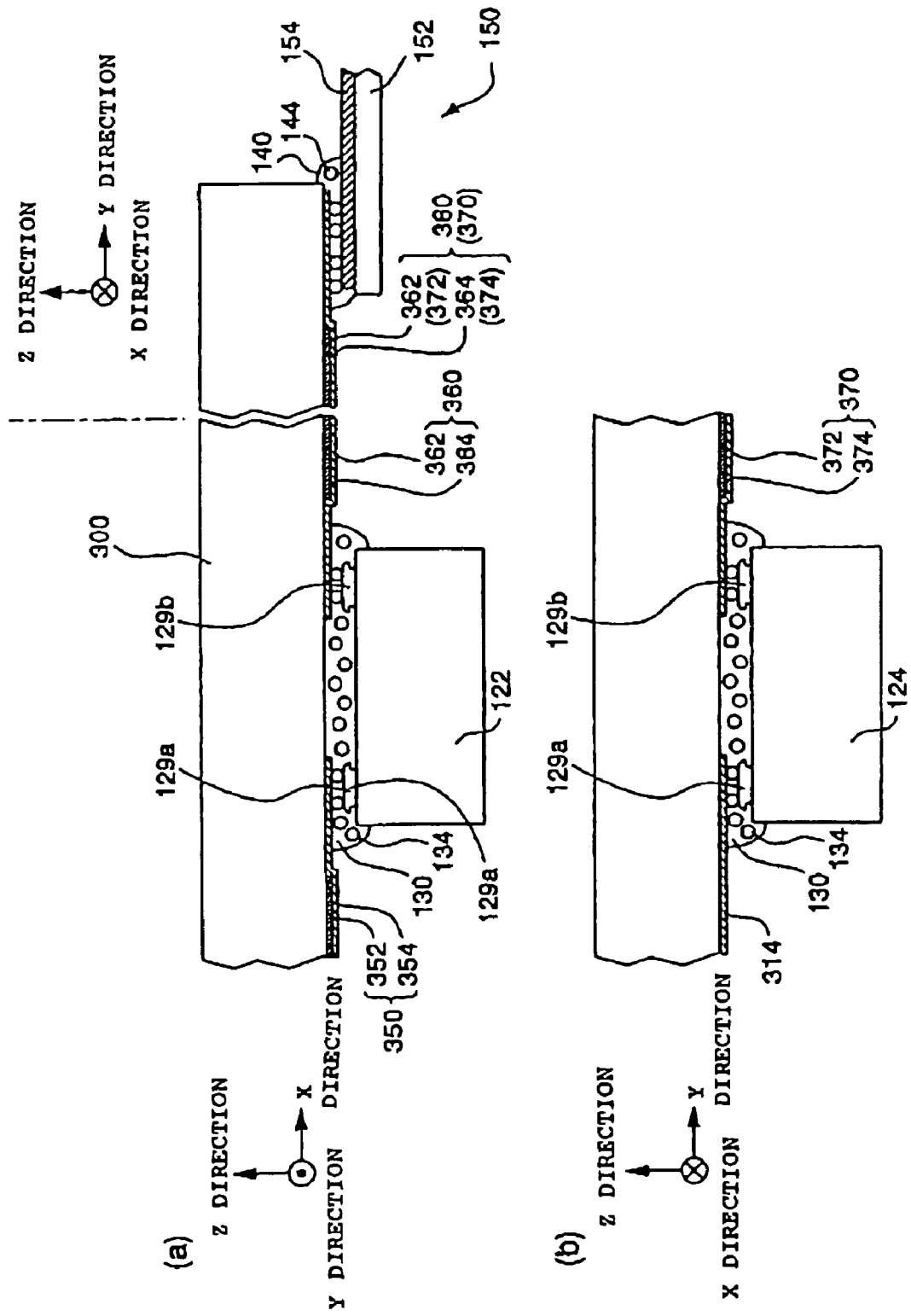
[FIG. 5]

[FIG. 6]
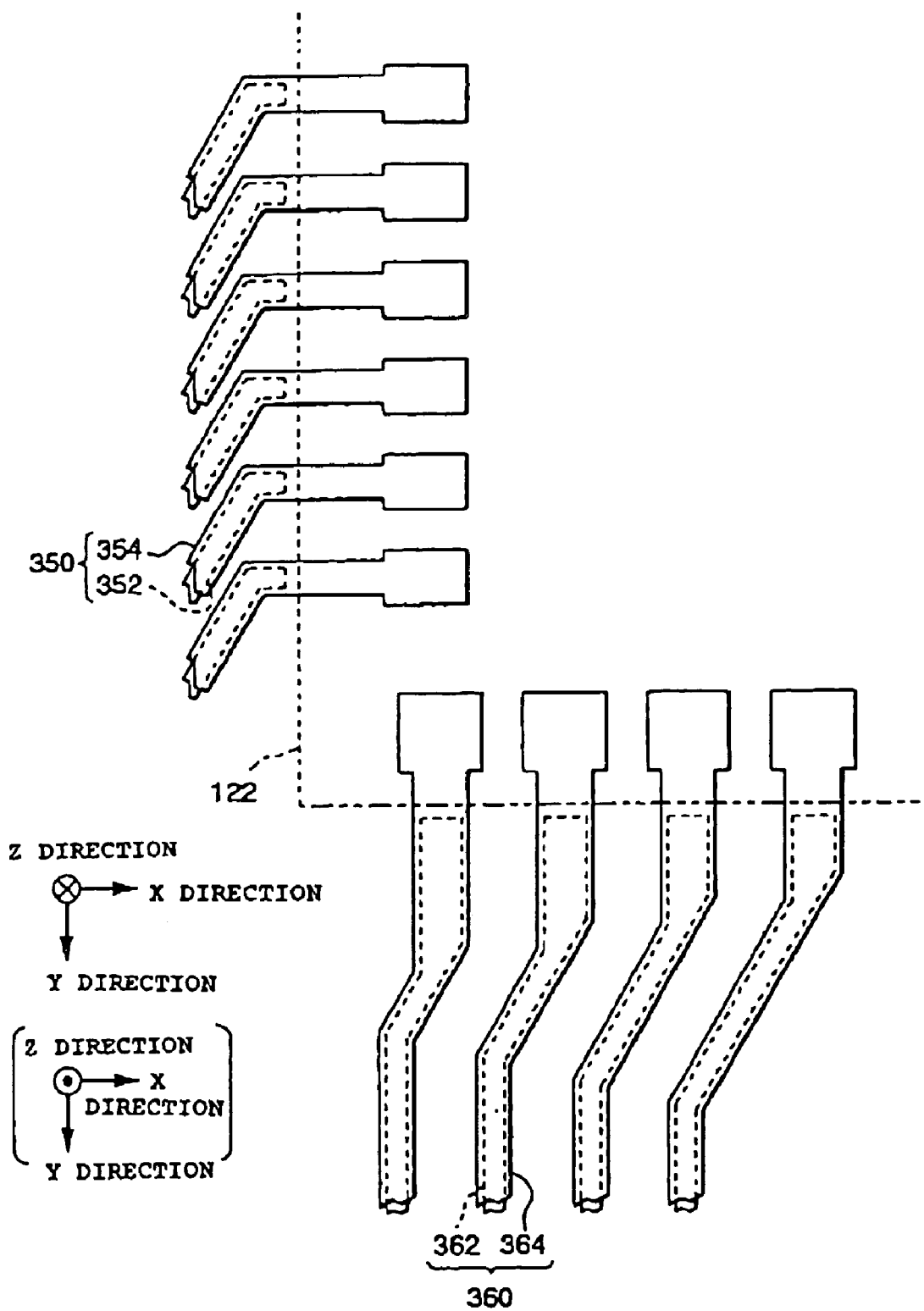

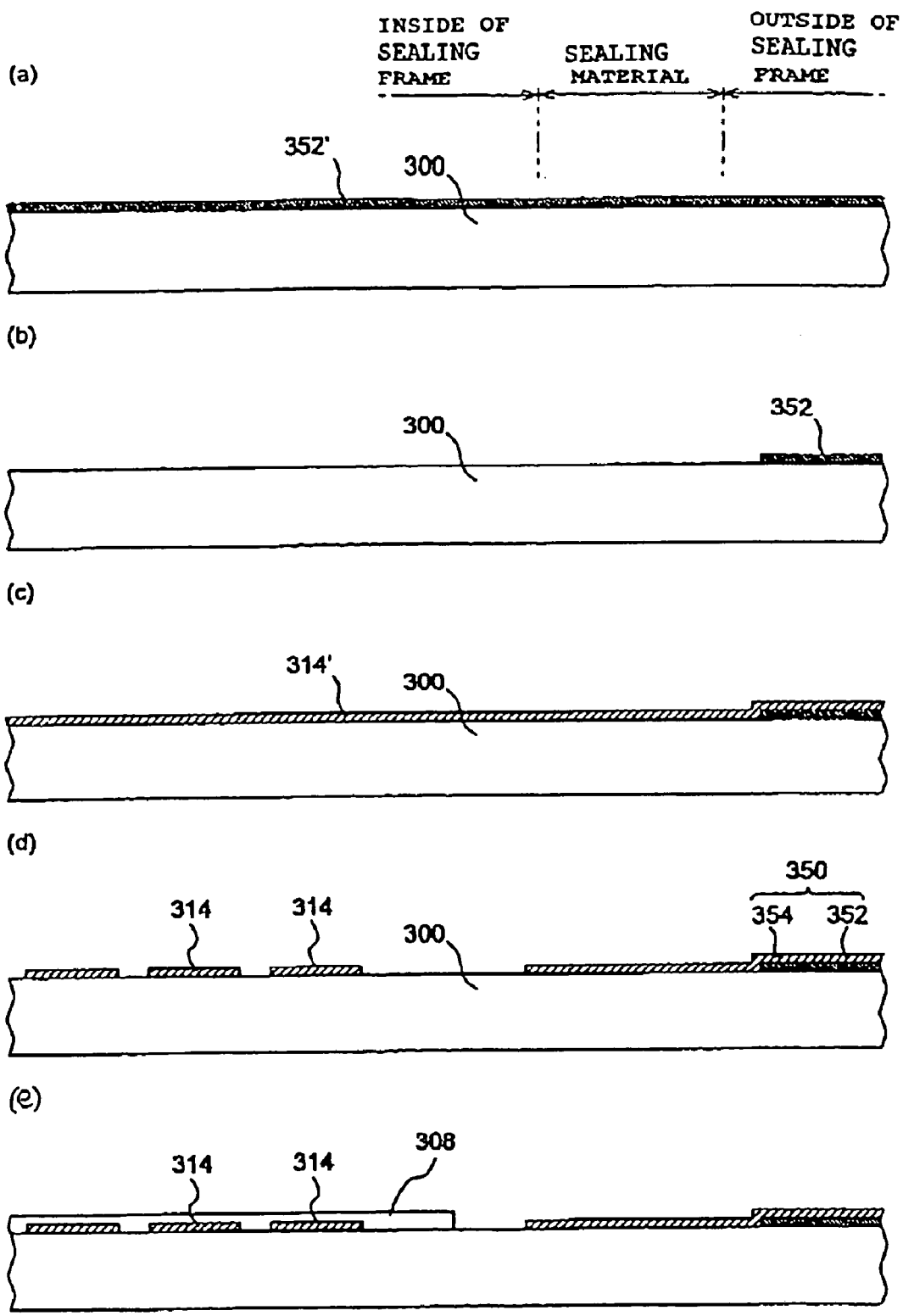
[FIG. 7]

[FIG. 8]
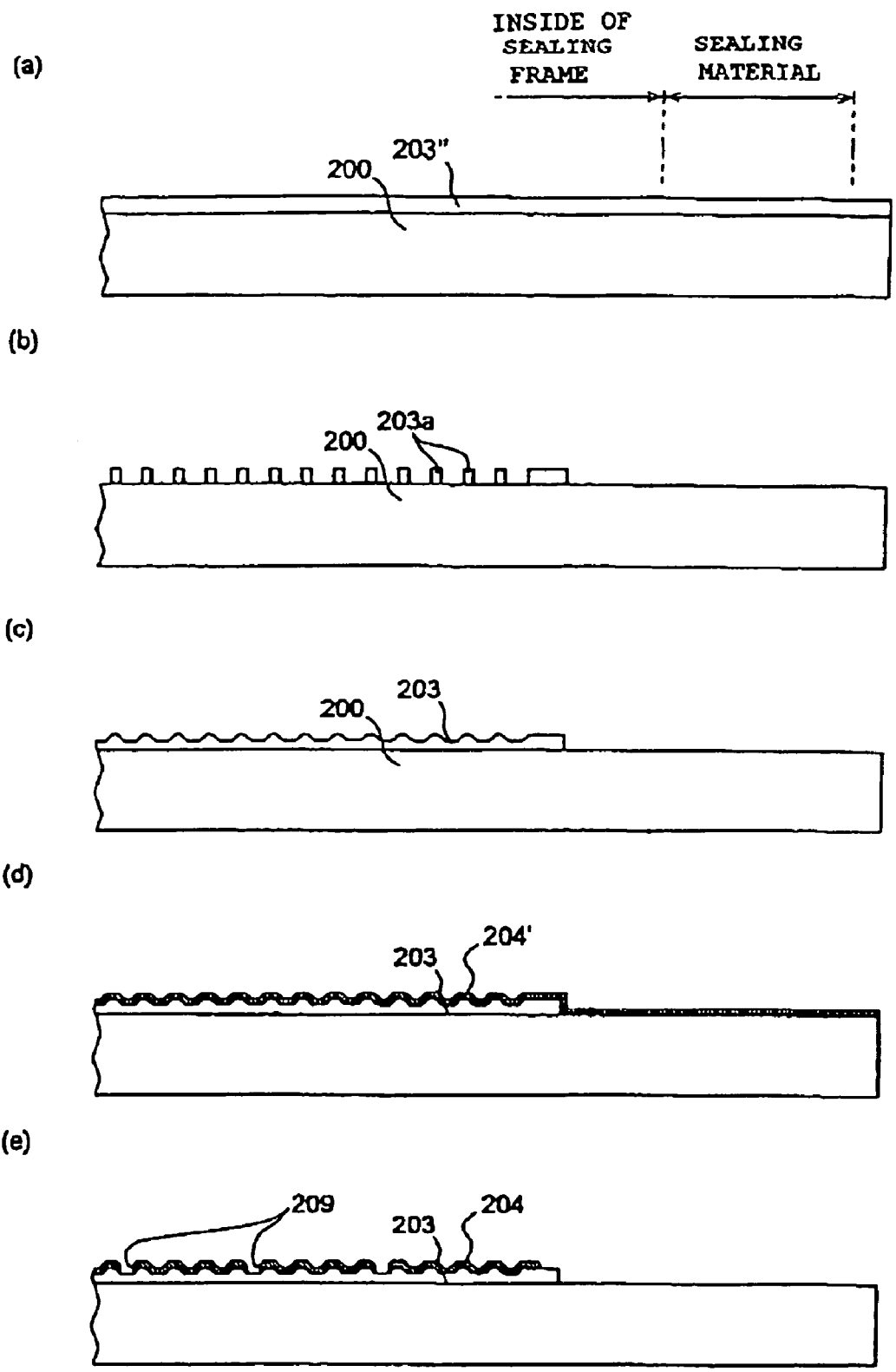

[FIG.9]
(f)
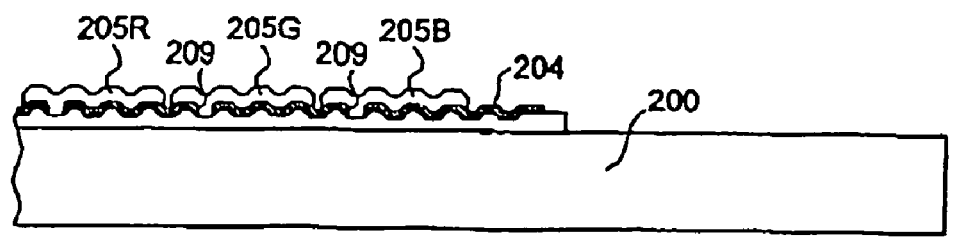
(g)
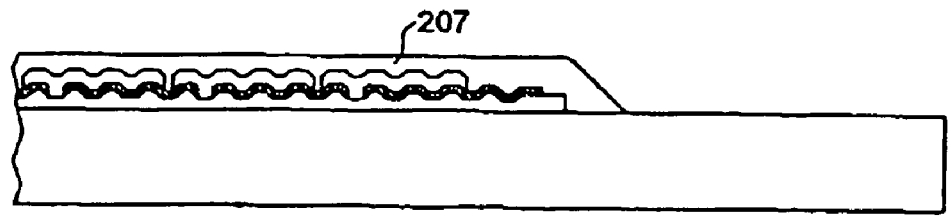
(h)
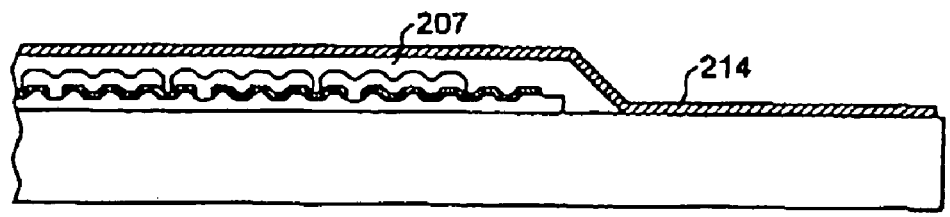
(i)
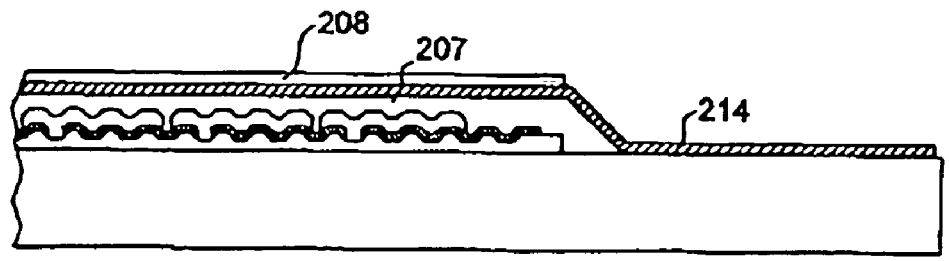

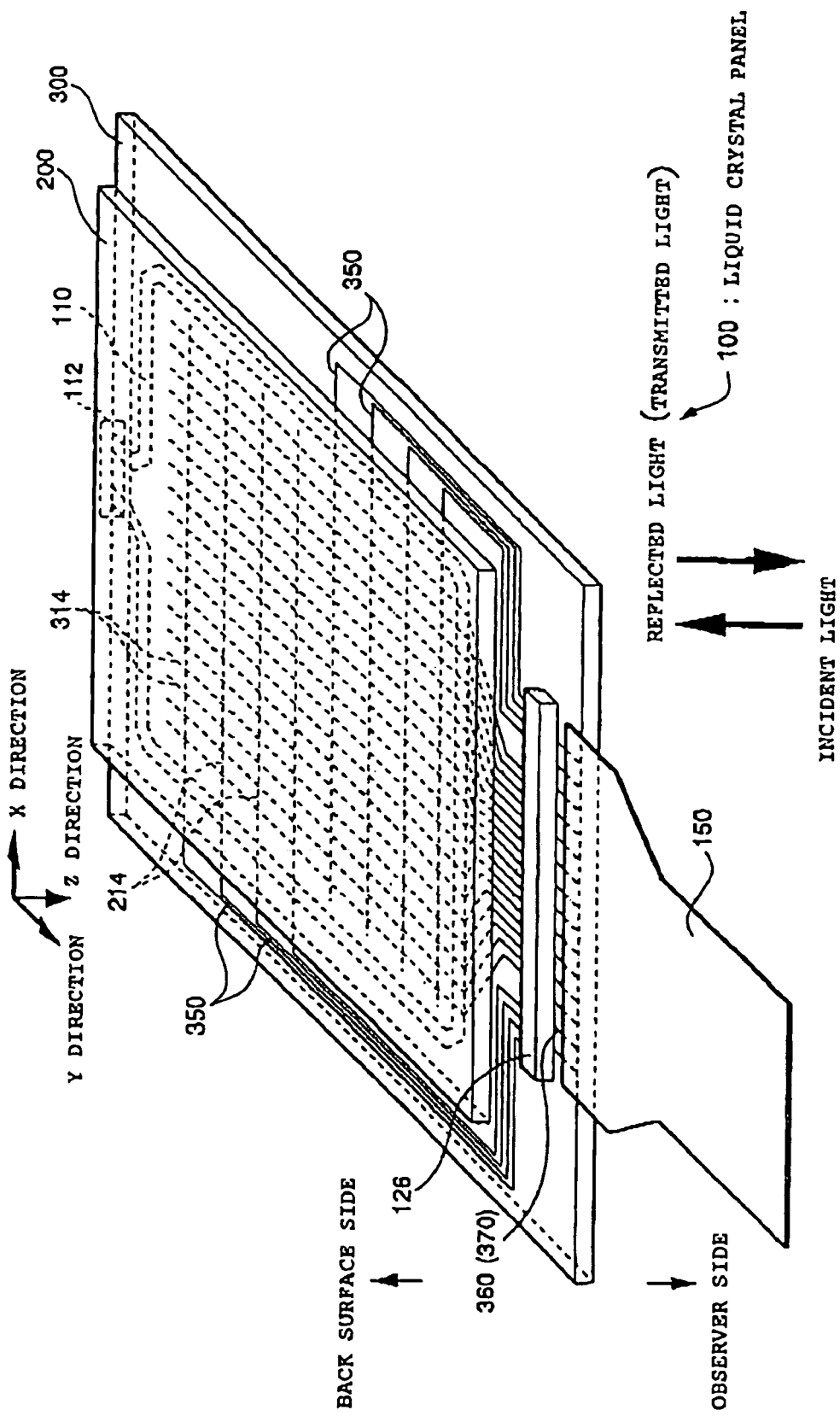
[FIG. 10]

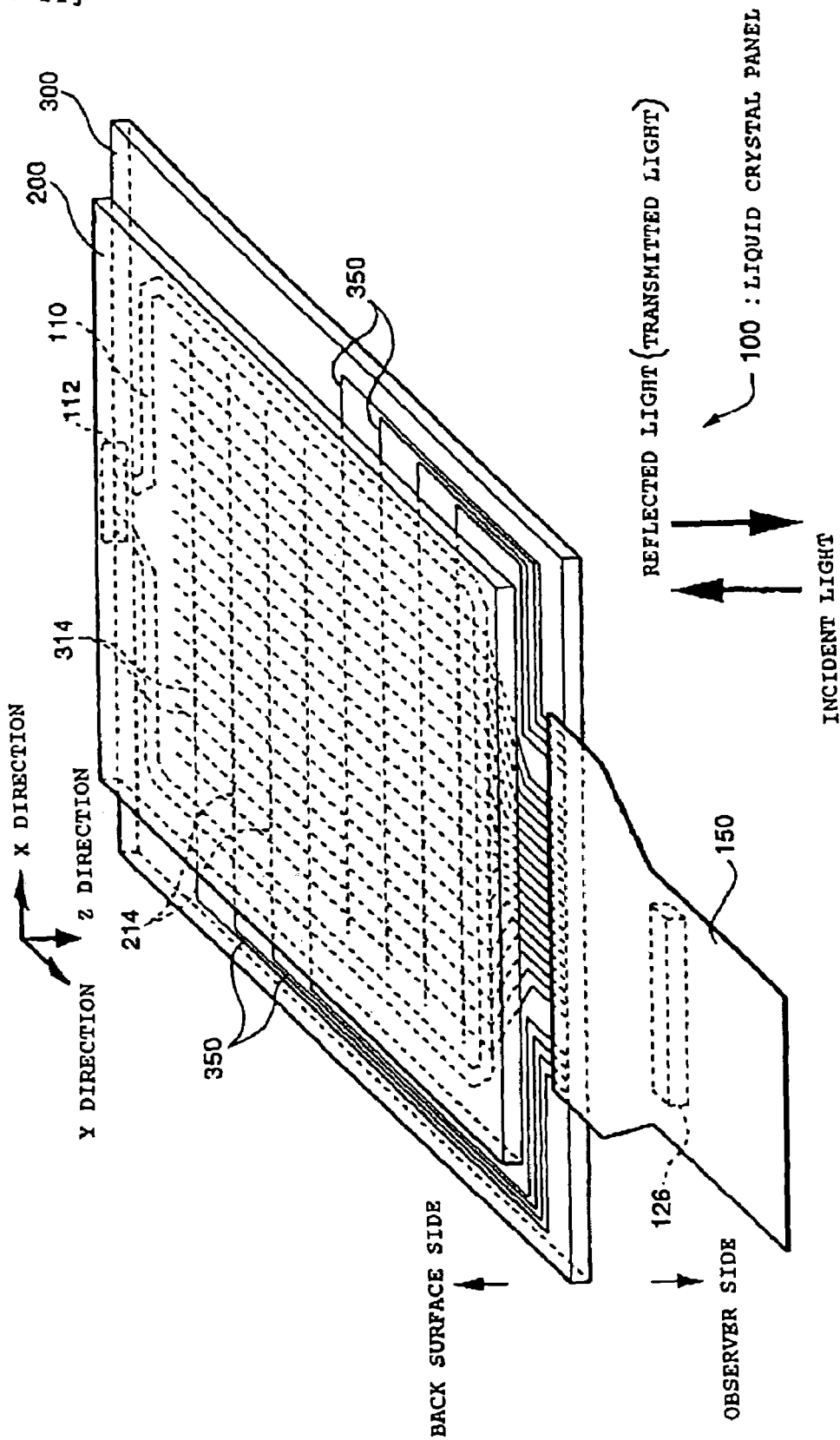
[FIG. 11]

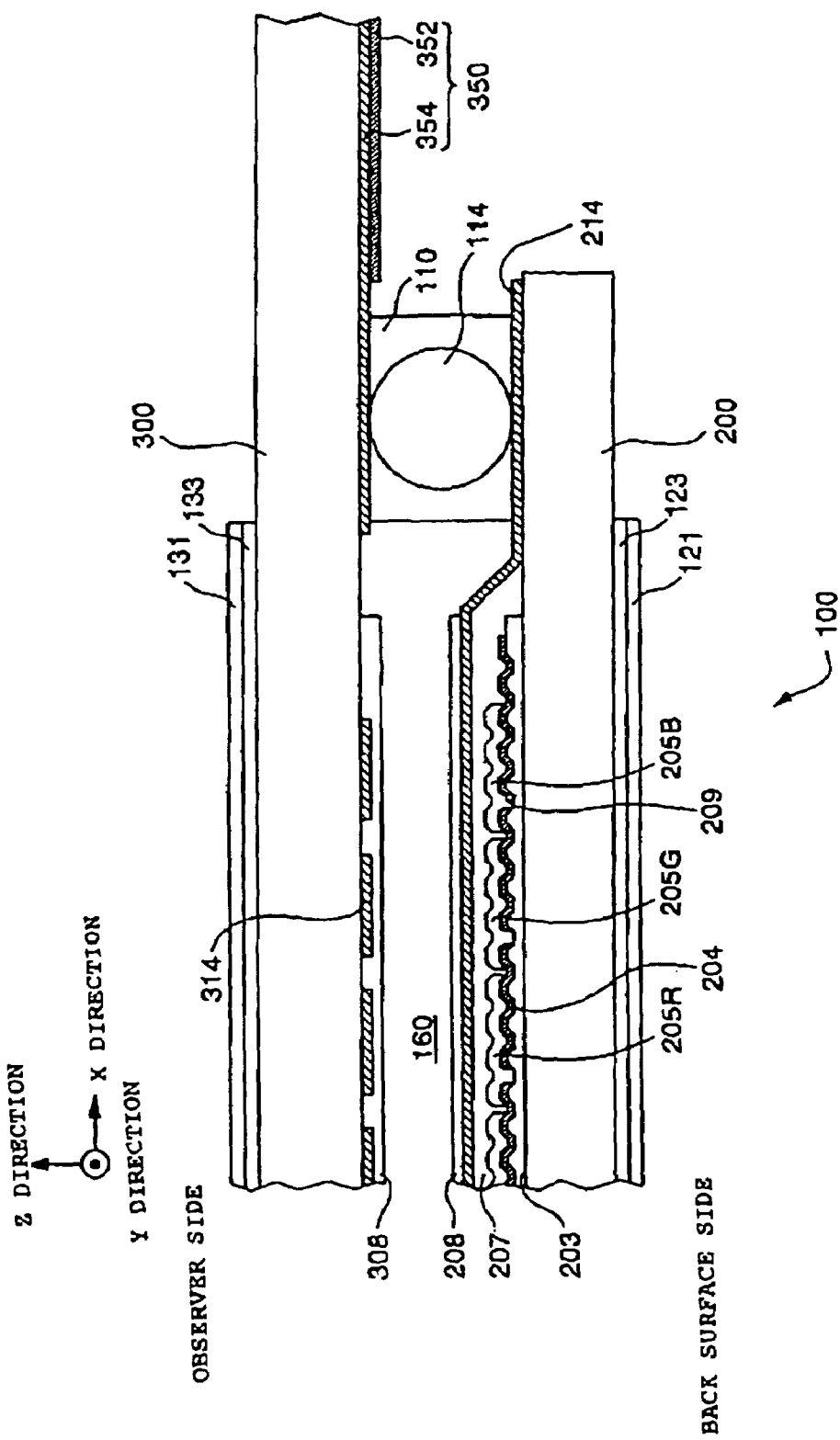
[FIG. 12]

[FIG. 13]
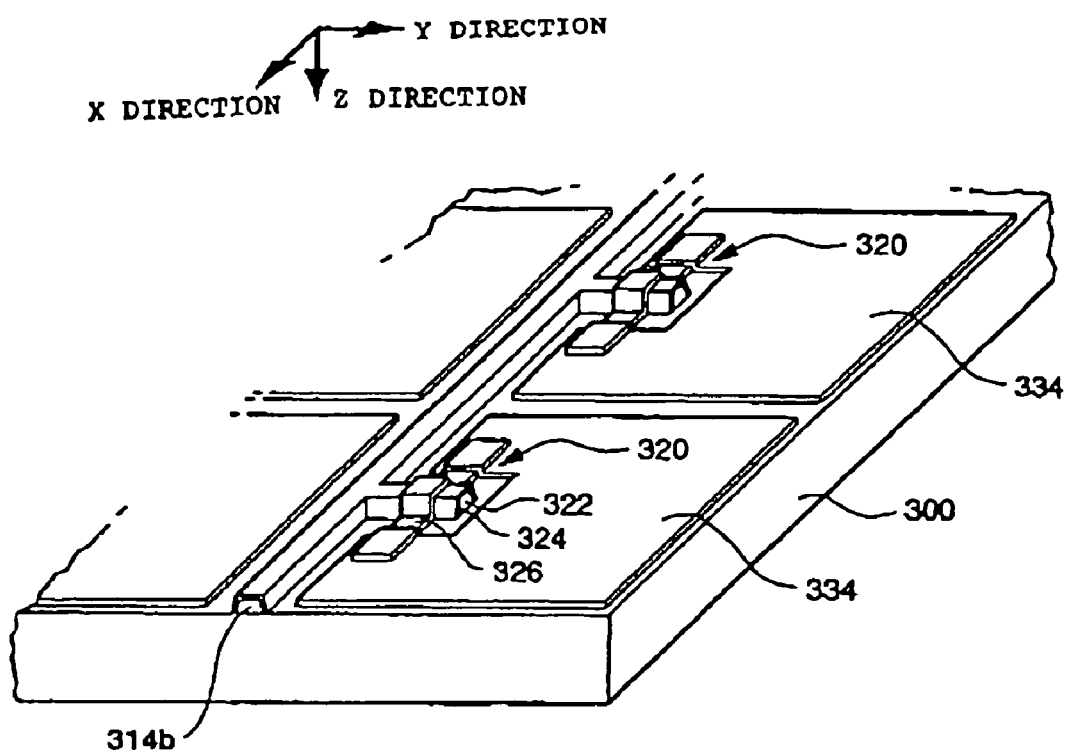

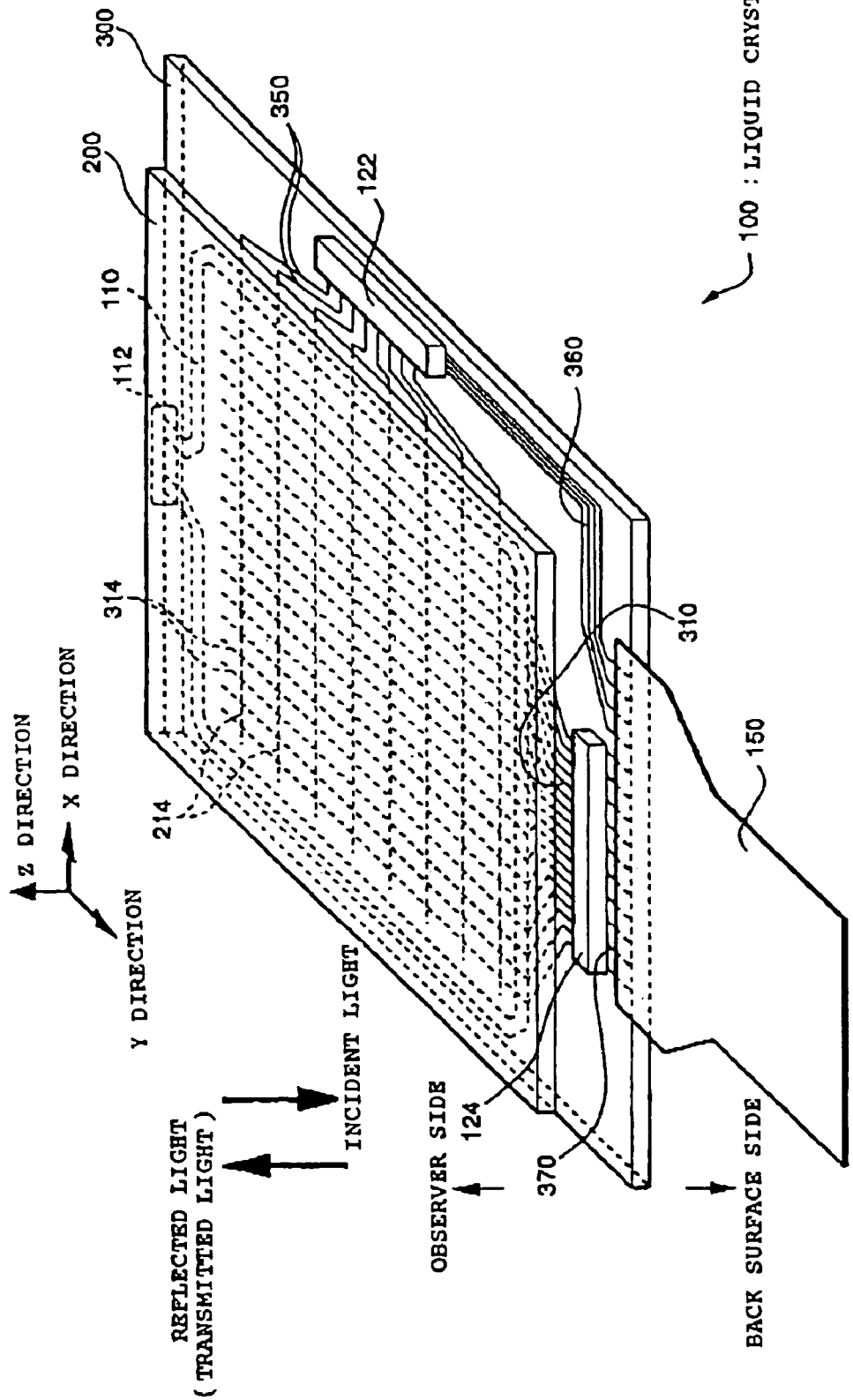
[FIG. 14]

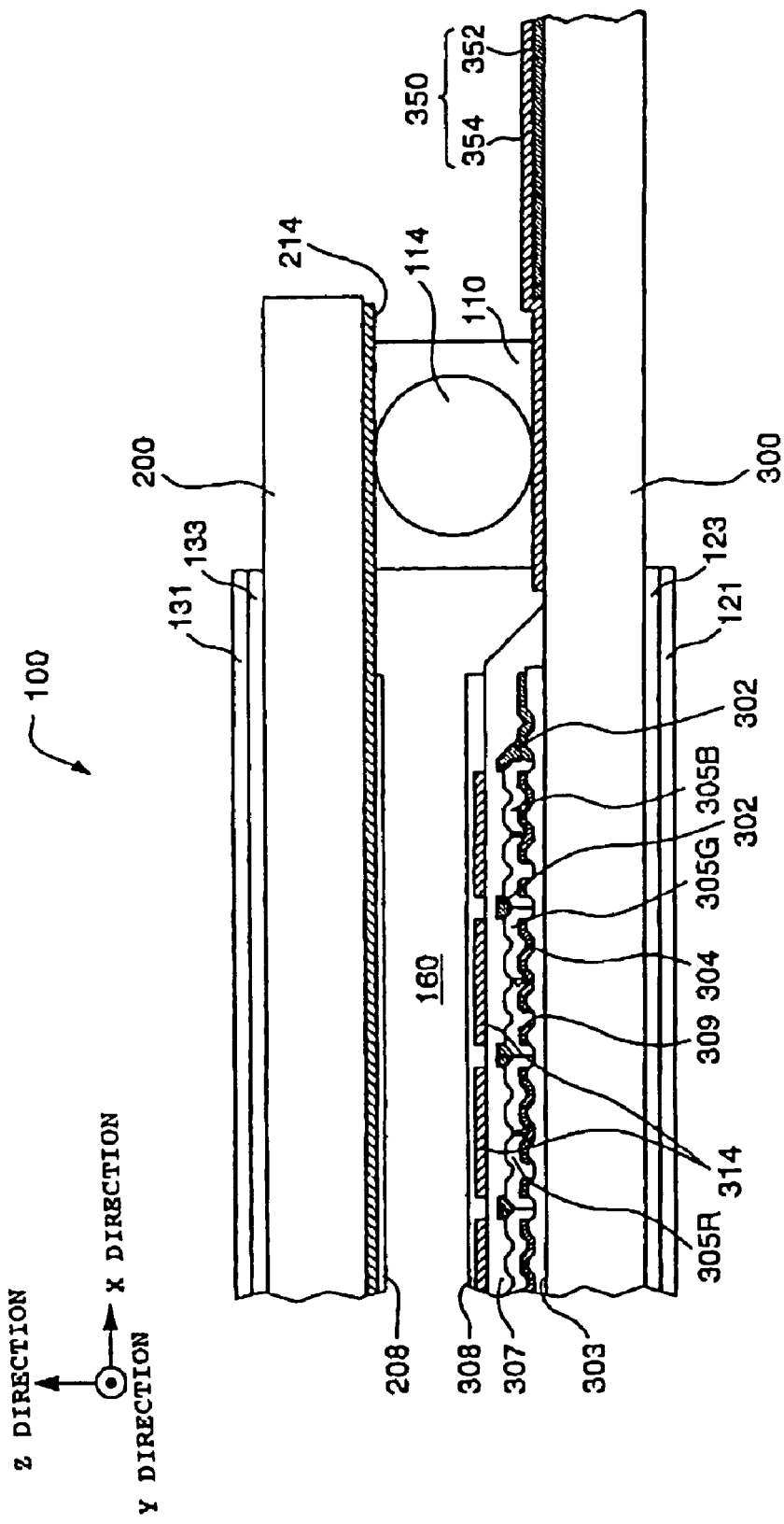
[FIG. 15]

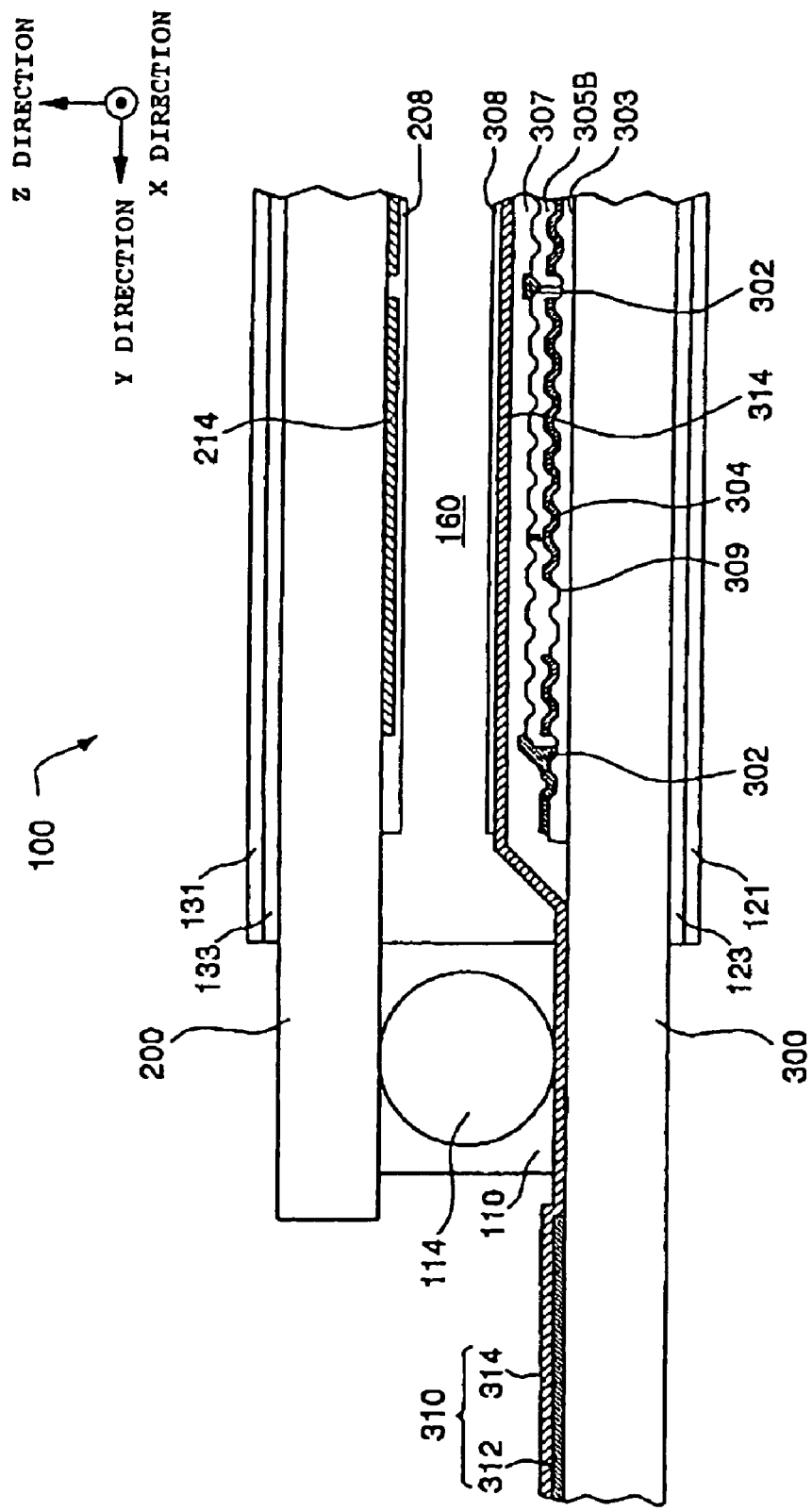
[FIG. 16]

[FIG. 17]
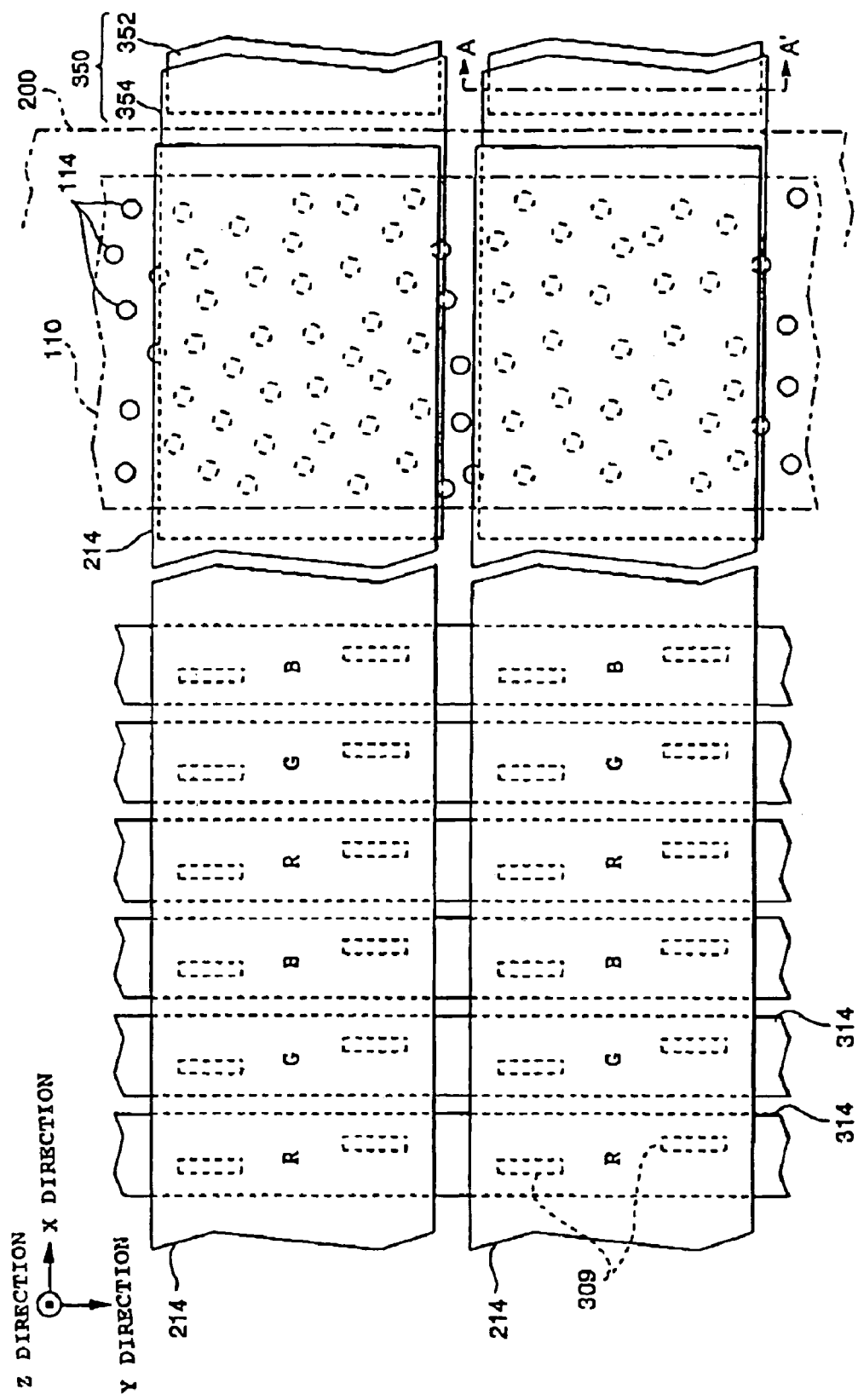

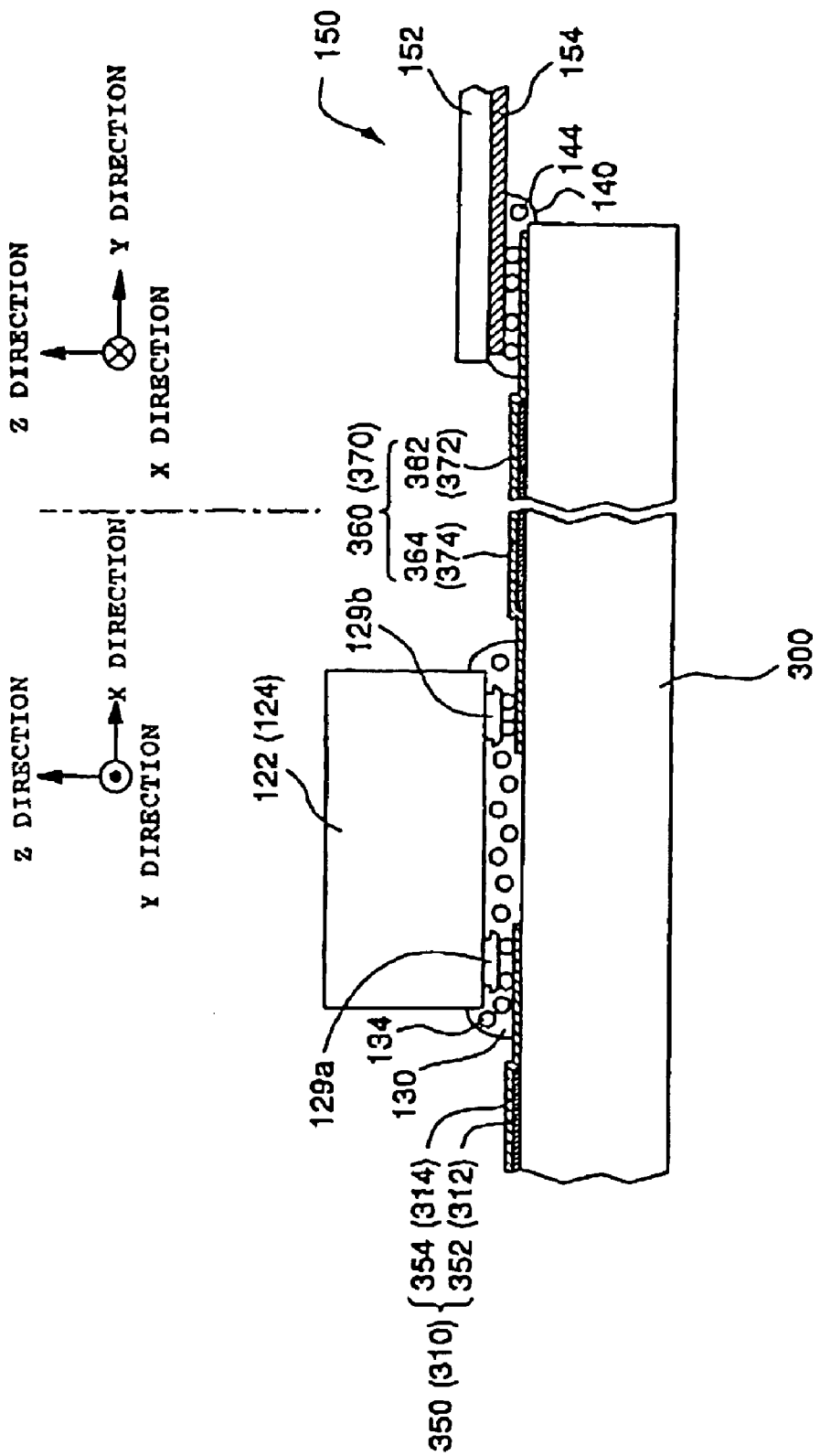
[FIG. 18]

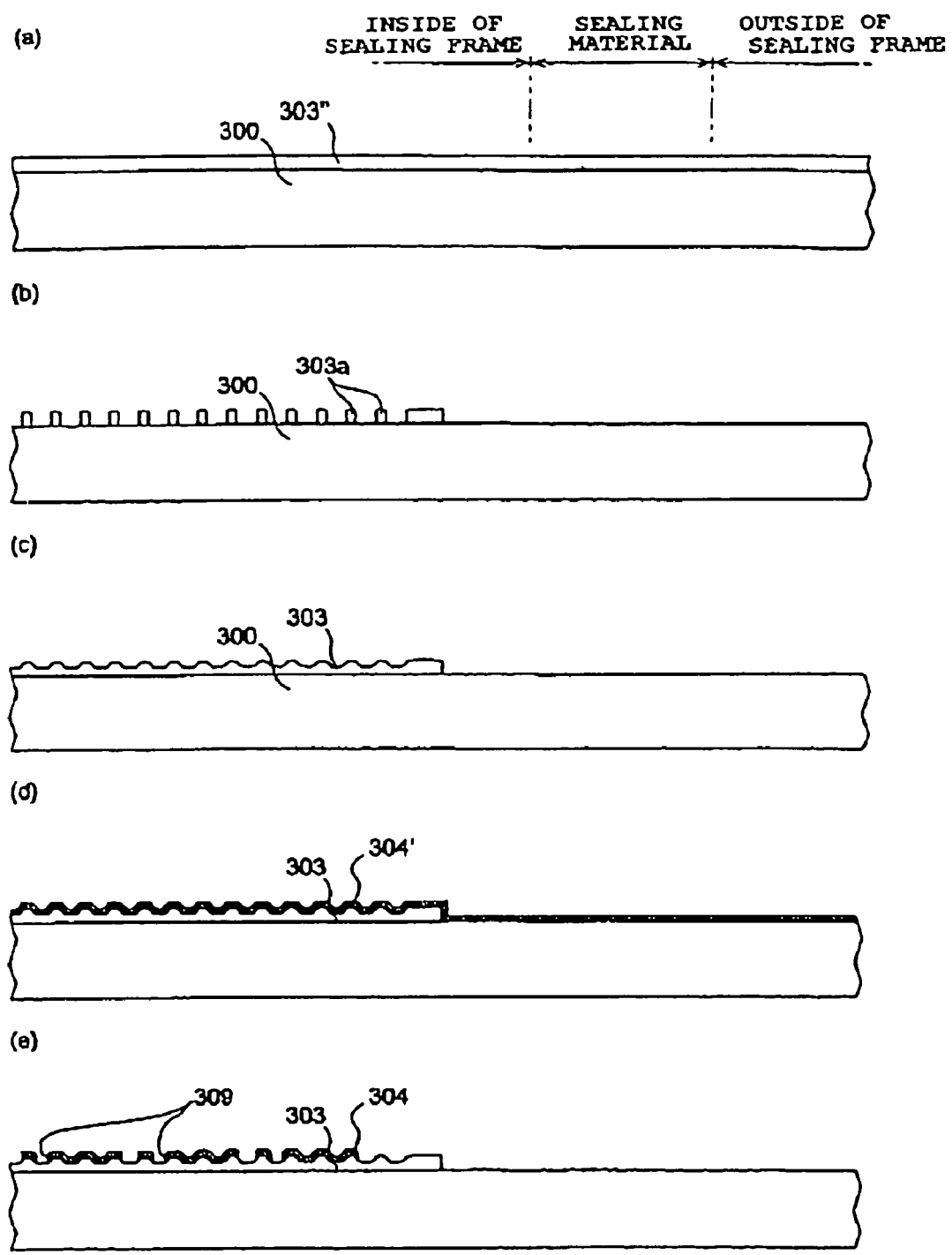

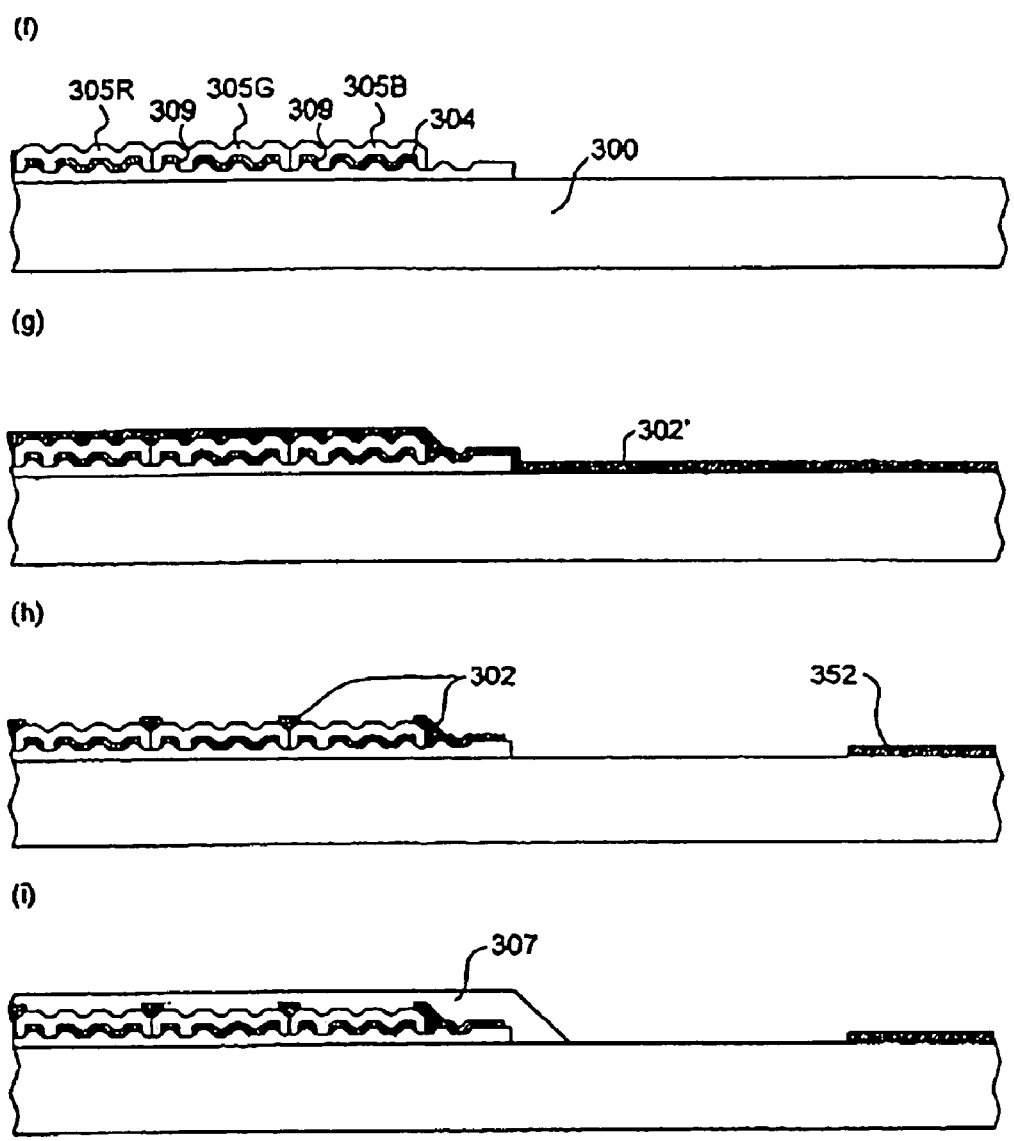
[FIG. 20]

[FIG. 21]
(j)
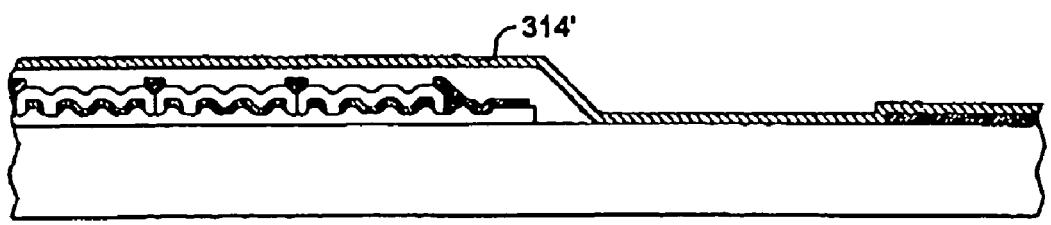
(k)
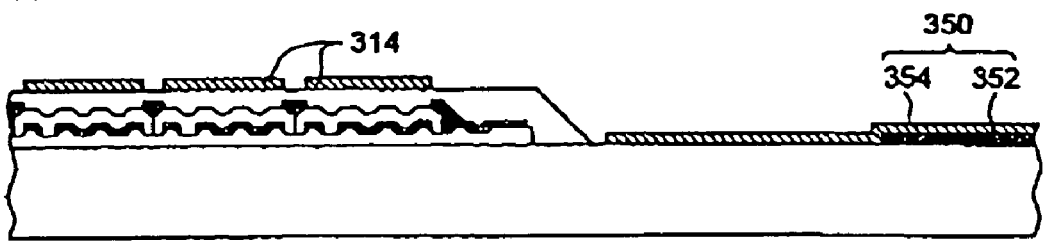
(l)
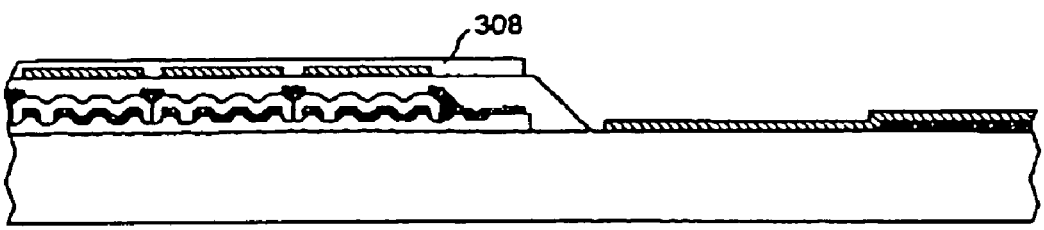

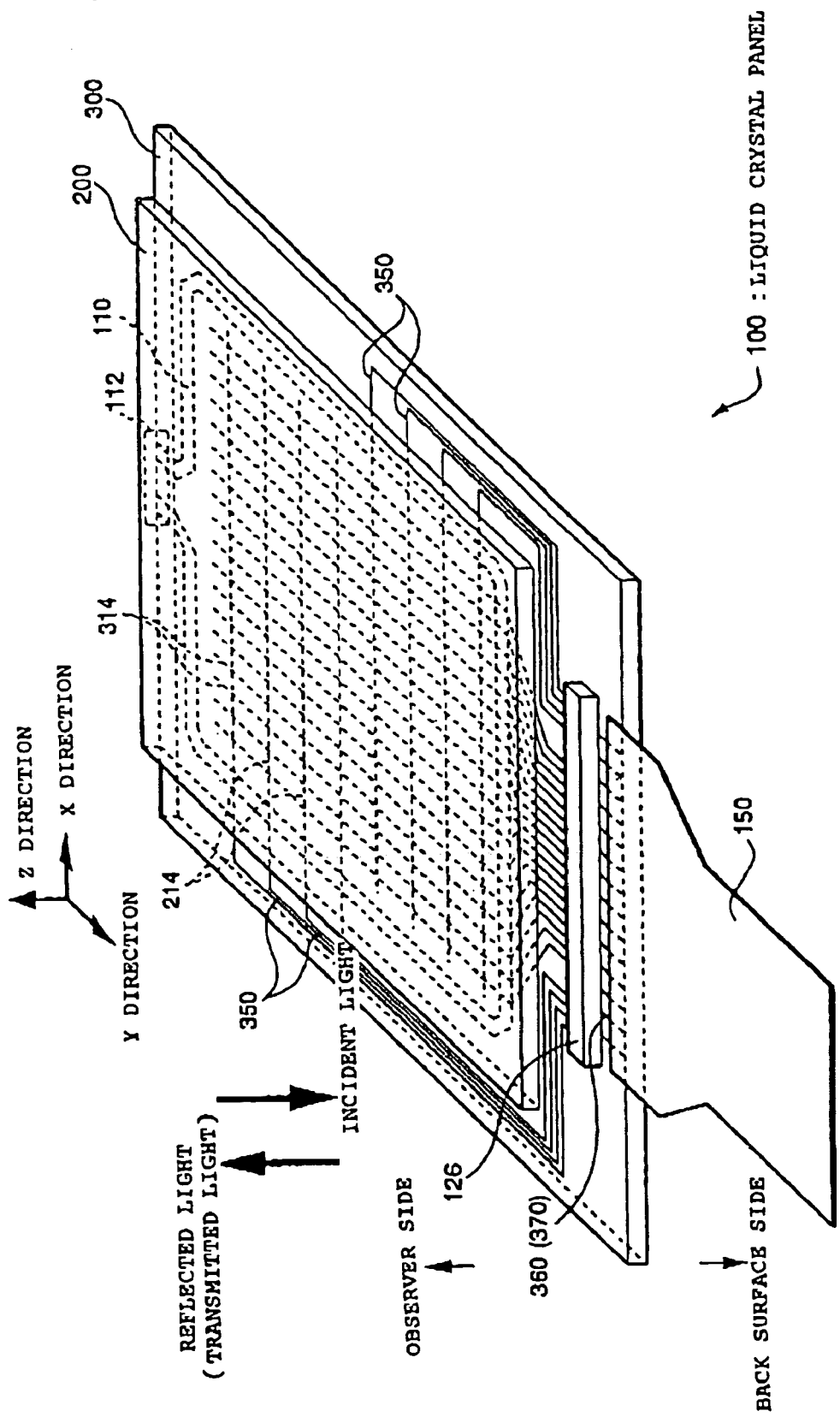

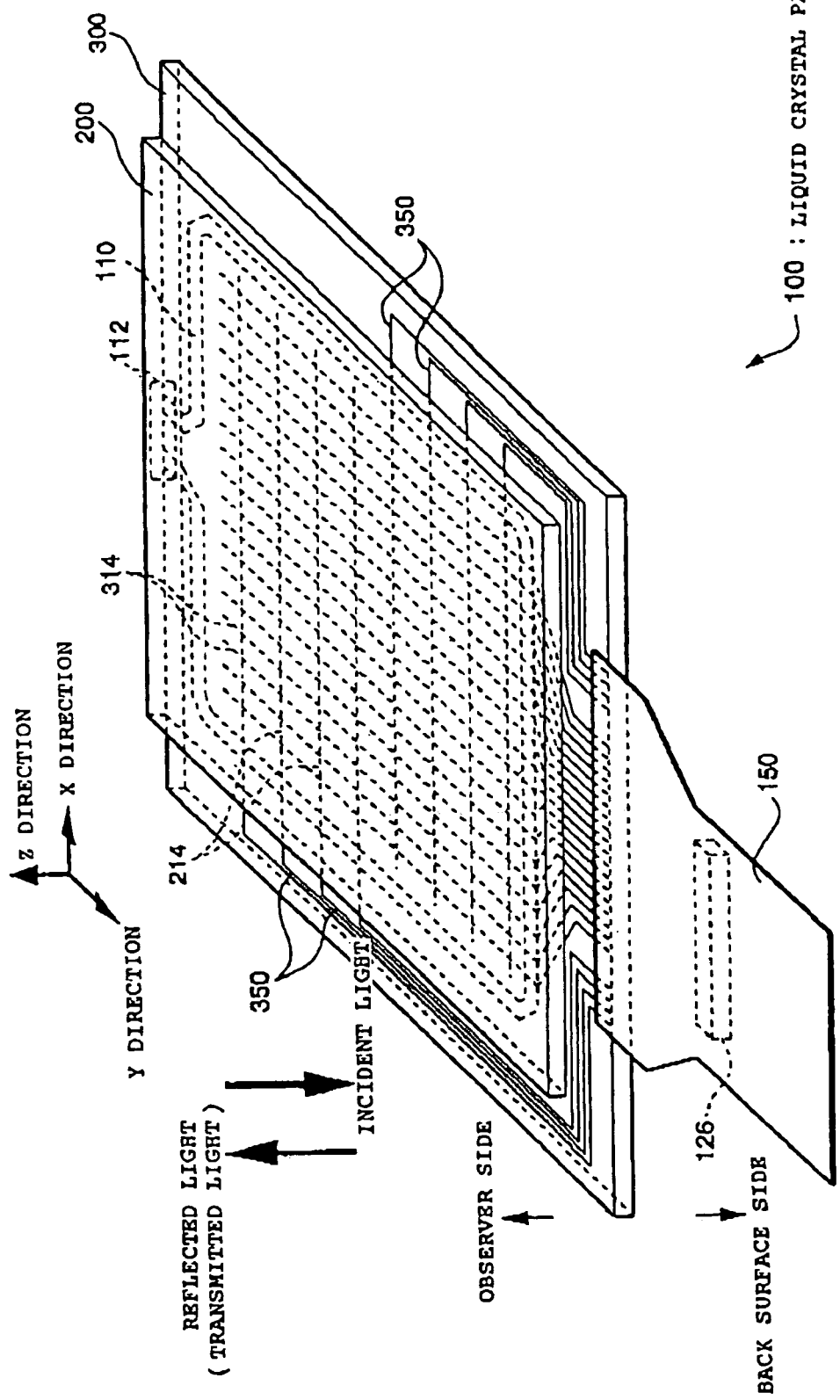
[FIG. 23]

[FIG. 24]
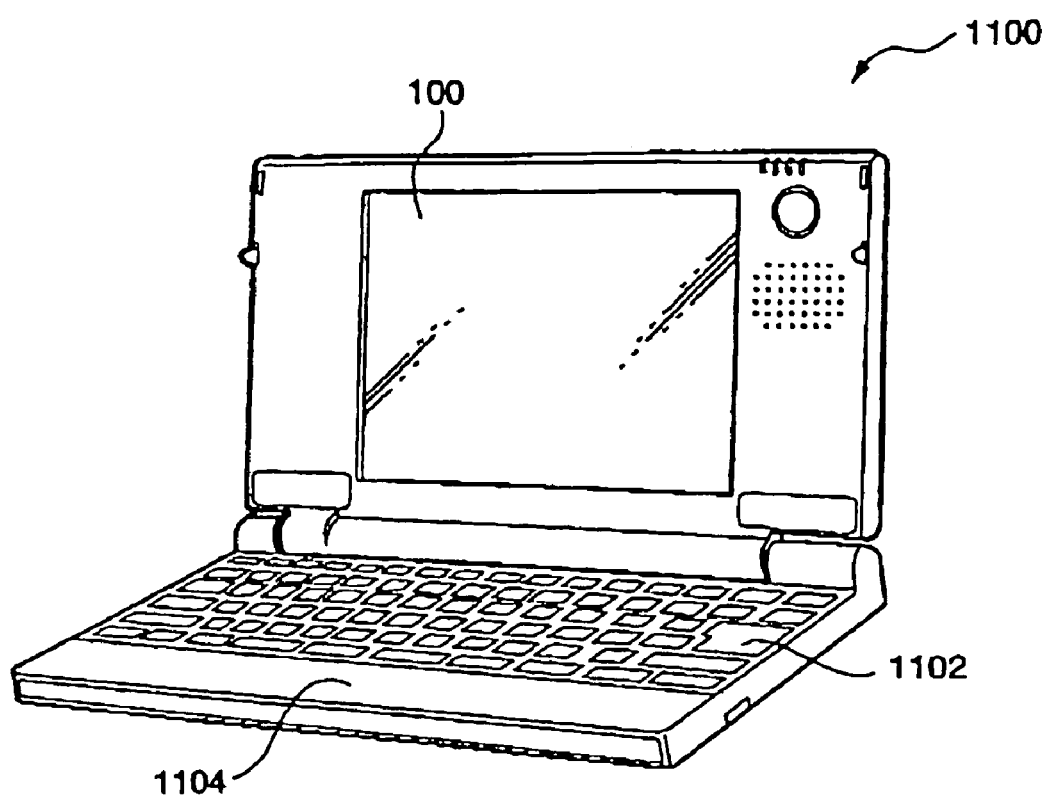

[FIG. 25]
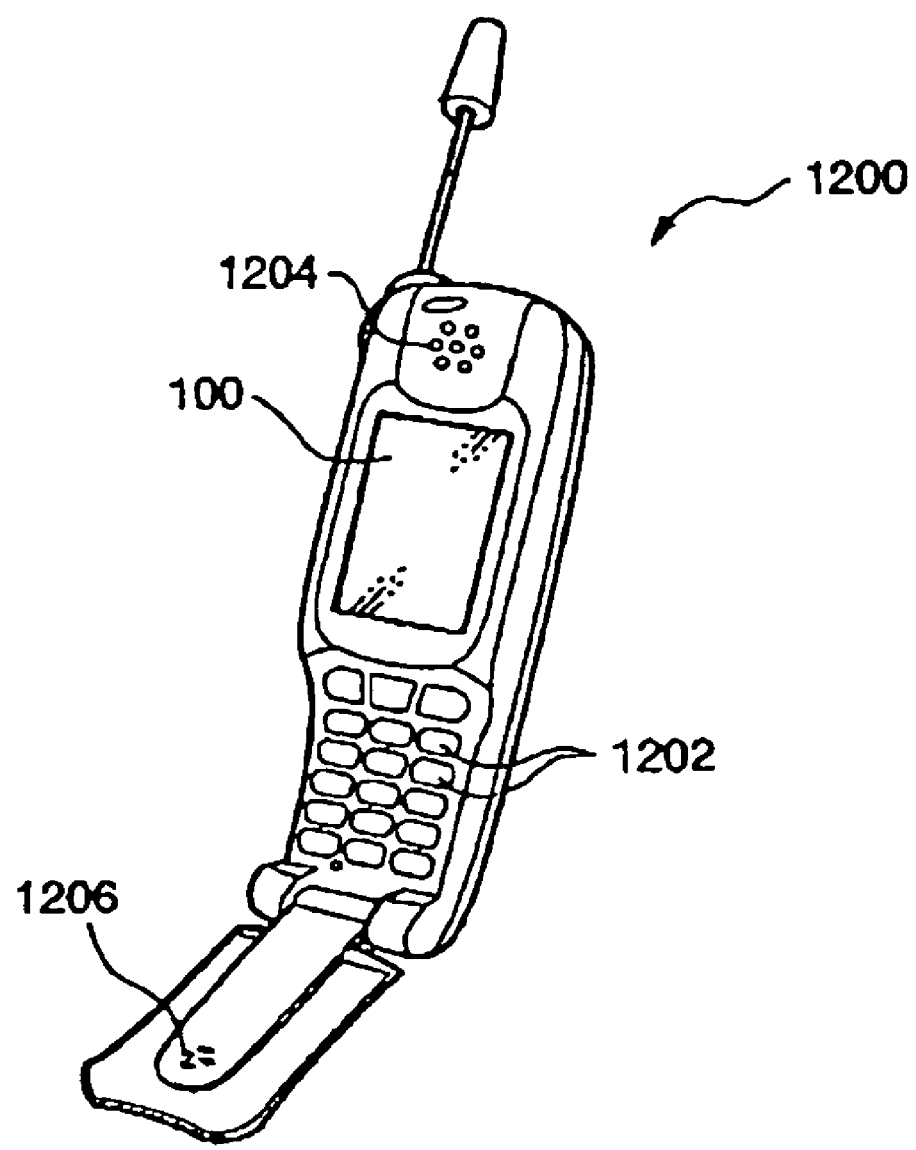

[FIG. 26]
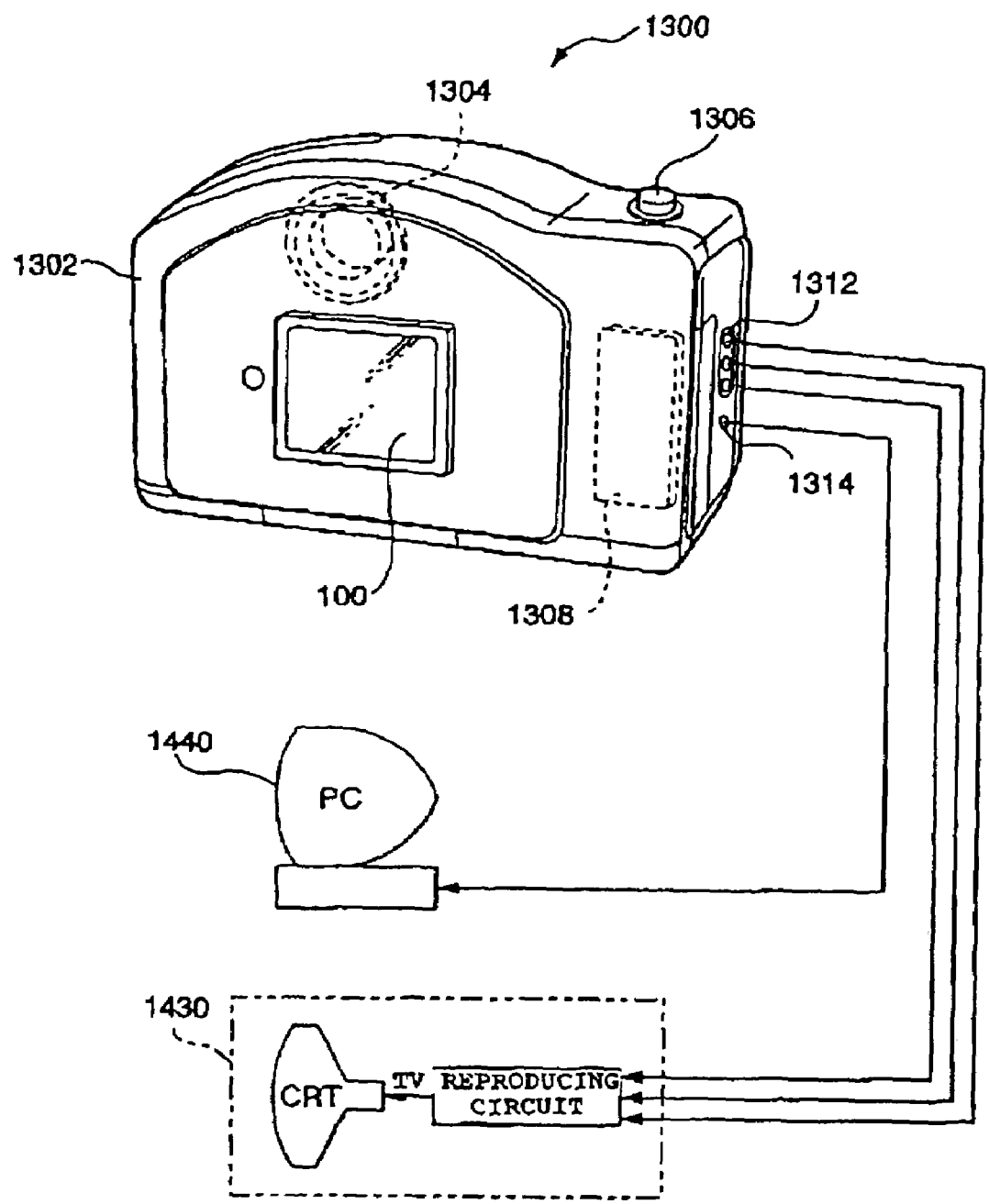

LIQUID CRYSTAL DEVICE, MANUFACTURING METHOD THEREFOR, AND ELECTRONIC APPARATUS

CROSS REFERENCE TO RELATED APPLICATIONS

This application is a divisional patent application of U.S. Ser. No. 09/865,186 filed May 24, 2001, now U.S. Pat. No. 6,768,533 claiming priority to Japanese Application No. 2001-103495 filed Apr. 2, 2001, Japanese Application No. 2000-154696 filed May 25, 2000 and Japanese Application No. 2000-154695 filed May 25, 2000, all of which are hereby incorporated by reference.

BACKGROUND OF THE INVENTION

1. Technical Field of the Invention

The present invention relates to liquid crystal devices which reduce wiring resistance, to manufacturing methods therefor, and to electronic apparatuses using the liquid crystal devices for display portions.

2. Description of the Related Art

As has been well known, since liquid crystal display devices have advantages in weight and electric power consumption compared to display devices using CRTs (cathode ray tubes), in particular, they are widely used for display portions of electronic apparatuses which are required to have portability.

Liquid crystal display devices generally have a structure in which two substrates are bonded to each other with a predetermined gap therebetween so that electrode forming surfaces thereof oppose each other, and liquid crystal is received in the gap; and when roughly classified in accordance with a driving mode, they can be classified into an active matrix type in which liquid crystal is driven by switching elements, and a passive matrix type in which liquid crystal is driven without using switching elements. In addition, the former, the active matrix type, can be further classified into a type which uses three-terminal elements, such as a thin-film transistor (TFT), as switching elements, and a type which uses two-terminal elements such as a thin-film diode (TFD).

The type which uses TFD elements as the switching elements among active matrix types and the simple passive matrix type have a structure in which scanning lines (common electrodes) are formed on one substrate and data lines (segment electrodes) are formed on the other substrate. Accordingly, in these types described above, since scanning signals (common signals) and data signals (segment signals) must be supplied by bonding an FPC substrate to each of the two substrates, problems of complicated bonding step and an increase in cost may arise. Accordingly, in the types described above, a technique has been proposed to bond one piece of FPC substrate to only one of the two substrates by using a structure in which all wirings or electrodes formed on the other substrate are connected to wirings formed on said one of the two substrates via conducting materials, that is, a structure is formed so that all wirings or electrodes formed on the other substrate are gathered on said one of the two substrates.

However, in the technique described above, the wirings formed on said one of the two substrates are composed of the same material as that used for transparent electrodes on said one of the two substrates, which apply a voltage to the liquid crystal. In this connection, as a material used for the transparent electrode mentioned above, ITO (Indium Tin Oxide) is generally used; however, the square resistivity of this transparent electrode material is high compared to that of a common metal. Accordingly, when the transparent electrode material described above is used for wirings for electrical connection in an area other than the display area, the resistance is naturally increased, and as a result, a problem may arise in that the image quality is adversely influenced.

In particular, recently, in order to reduce the number of connection points between a liquid crystal panel and a FPC substrate, driver ICs for driving the scanning lines (common electrodes) and the data lines (segment electrodes) are mounted on a glass substrate of the liquid crystal panel in some cases. In the case described above, various control signals and clock signals must be supplied to the driver ICs; however, when the transparent electrode material described above is used for wiring from the FPC substrate to the driver ICs, since the time constant is increased concomitant with an increase in wiring resistance, deformation of waveforms, a decrease in amplitude, and the like occur, and as a result, a problem may arise in that the operation margin is narrowed.

The present invention was made in view of the problems described above, and an object of the present invention is to provide a liquid crystal device which reduces resistance of wirings formed on a substrate, a manufacturing method therefor, and an electronic apparatus using the liquid crystal device for the display portion.

SUMMARY OF THE INVENTION

Accordingly, a liquid crystal device of one aspect of the present invention is a liquid crystal device having a first substrate and a second substrate, which are disposed to oppose each other, and liquid crystal enclosed in a gap between the first substrate and the second substrate, which comprises: a first transparent electrode provided on the first substrate; a first wiring provided on the second substrate; and a conductive material connecting the first transparent electrode and the first wiring; wherein the first wiring comprises a metal oxide film and a conductive film having a resistance lower than that of the metal oxide film. According to the structure described above, since the first wiring is a laminated film composed of a chemically stable metal oxide film and a chemically unstable conductive film having a resistance lower than that of the metal oxide film, compared a single layer composed of one of the two films described above, a lower resistance and improved stabilization of the wiring can be obtained.

In the structure described above, the conductive material is composed of nonconductive particles formed of, for example, a plastic covered with a metal such as gold (Au), and a metal oxide film generally has better adhesion with this covering metal. As a result, in the structure described above, the conductive film of the first wiring is preferably formed on an area other than the portion connecting with the conductive material.

In addition, preferably, the structure described above further comprises a driver IC provided on the second substrate for driving the liquid crystal, wherein the driver IC comprises an output side bump for supplying a signal, the output side bump is connected to the first wiring, and the conductive film is formed on an area other than the portion connecting with the driver IC. When the driver IC for driving the liquid crystal is mounted on the second substrate via the first wiring, the conductive material, and the first transparent electrode as described above, the number of connection points with the external can also be decreased.

Furthermore, when the driver IC is bonded to the wiring, an adhesive having conductive particles dispersed therein is used, and similar to the conductive material described above, the conductive particles are formed of nonconductive particles such as a plastic covered with a metal such as gold (Au). Accordingly, when the conductive film is formed on an area other than the portion connecting with the driver IC, the metal oxide film and the covering metal contained in the conductive material are brought into contact with each other, and as a result, the adhesion therebetween is improved.

Furthermore, preferably, the structure described above further comprises a second wiring which is provided on the second substrate and which comprises a metal oxide film and a conductive film having a resistance lower than that of the metal oxide film; and a driver IC provided on the second substrate for driving the liquid crystal; wherein the driver IC comprises an input side bump for inputting a signal, the input side bump is connected to the second wiring, and the conductive film included in the second wiring is formed on an area other than the portion connecting with the driver IC. As a result, since the second wiring is a laminated film formed of a chemically stable metal oxide film and a chemically unstable conductive film having a resistance lower than that of the metal oxide film, compared to a single layer composed of one of the two films described above, a lower resistance of the wiring can be obtained. Accordingly, since the signals are supplied to the driver IC driving the liquid crystal via the second wiring having a lower resistance, the influence caused by voltage drop and the like can be suppressed to be small. In addition, when the metal oxide film is provided at the portion connecting with the driver IC without using the low-resistance conductive film, the adhesion with the covering metal contained in the conductive material can also be improved.

The liquid crystal device having the second wiring and the IC driver preferably further comprises a first protruding area which is provided in the vicinity of one edge of the second substrate and which does not overlap with the first substrate; and a second protruding area which is provided in the vicinity of another edge, intersecting said one edge, of the second substrate and which does not overlap with the first substrate; wherein the driver IC is provided on the first protruding area, and the second wiring is provided on the first protruding area and on the second protruding area.

In addition, structure described above preferably further comprises an external circuit substrate connected to the second wiring on the second protruding area; wherein the conductive film included in the second wiring is formed on an area other than the portion connecting with the external circuit substrate. Accordingly, signals can be supplied to the IC driver from the external circuit substrate via the second wiring having a lower resistance.

In addition, in the structure described above, it is also preferable that the liquid crystal device further comprise a second transparent electrode provided on the second substrate and a driver IC connected to the second transparent electrode. Accordingly, a signal can be supplied to the second transparent electrode by the driver IC.

In addition, the liquid crystal having the second transparent electrode and the IC driver, which are provided on the second substrate, preferably further comprises a second wiring which is provided on the second substrate and which comprises a metal oxide film and a conductive film having a resistance lower than that of the metal oxide film; a first protruding area which is provided in the vicinity of one edge of the second substrate and which does not overlap with the first substrate; and a second protruding area which is provided in the vicinity of another edge, intersecting said one edge, of the second substrate; wherein the driver IC is provided on the first protruding area and comprises an input side bump for inputting a signal from the second wiring, and the second wiring is provided on the first protruding area and on the second protruding area. In the structure described above, since the second wiring is a laminated film formed of a chemically stable metal oxide film and a chemically unstable conductive film having a resistance lower than that of the metal oxide film, compared to a single layer composed of one of the two films, a lower resistance and improved stabilization of the wiring can be obtained. As a result, since signals are supplied to the driver IC via the second wiring having a lower resistance, the influence of voltage drop and the like can be suppressed to be small.

In addition, in the structure described above, the conductive film included in the second wiring is preferably formed on an area other than the portion connecting with the driver IC. At the portion connecting with the driver IC, when the metal oxide film is provided without using the low-resistance conductive film, the adhesion of the metal oxide film with the covering metal contained in the conductive material can also be improved.

Accordingly, since an electronic apparatus according to another aspect of the present invention comprises the liquid crystal device described above, the wiring resistance is decreased, and as a result, adverse influence to the display quality and reduction in operation margin of the driving circuit can be prevented.

In addition, a liquid crystal device in accordance with another aspect of the present invention is a liquid crystal device having a first substrate and a second substrate, which are disposed to oppose each other, and liquid crystal enclosed in a gap between the first substrate and the second substrate, which comprises: a first transparent electrode provided on the first substrate; a first wiring provided on the second substrate; a conductive material connecting the first transparent electrode and the first wiring; a second transparent electrode provided on the second substrate; and a second wiring which is provided on the second substrate and which is connected to the second transparent electrode; wherein at least one of the first and the second wirings comprises a metal oxide film and a conductive film having a resistance lower than that of the metal oxide film. According to the structure described above, since the first and the second wirings are gathered on the second substrate, the connection with the external can be easily performed. In addition, since at least one of the first and the second wirings is a laminated film formed of a chemically stable metal oxide film and a chemically unstable conductive film having a resistance lower than that of the metal oxide film, compared to a single layer composed of one of the two films, a lower resistance and improved stabilization of the wiring can be obtained.

In the structure described above, the liquid crystal device preferably further comprises a driver IC provided on the second substrate for driving the liquid crystal; wherein the driver IC comprises an output side bump for supplying a signal, and the output side bump is connected to the first or the second wiring. As described above, when the driver IC connected to the first or the second wiring is mounted on the second substrate, the number of connection points with the external can be reduced.

In addition, in the structure described above, the liquid crystal device preferably further comprises an external circuit substrate supplying signals to each of the first and the second wirings. Accordingly, since signals are supplied from the external circuit substrate to the first and the second wirings, it is not necessary to mount an IC driver on the second substrate.

In addition, a liquid crystal device in accordance with another aspect of the present invention is a liquid crystal device having a first substrate and a second substrate, which are disposed to oppose each other, and liquid crystal enclosed in a gap between the first substrate and the second substrate, which comprises: a first protruding area which is provided in the vicinity of one edge of the second substrate and which does not overlap with the first substrate; a second protruding area which is provided in the vicinity of another edge, intersecting said one edge, of the second substrate and which does not overlap with the first substrate; and a wiring which is provided on the first protruding area and on the second protruding area; wherein the wiring comprises a metal oxide film and a conductive film having a resistance lower than that of the metal oxide film. According to the structure described above, since the wiring is a laminated film formed of a chemically stable metal oxide film and a conductive film having a resistance lower than that of the metal oxide film, even when the wiring is provided on the first and the second protruding portions, a lower resistance of the wiring can be obtained.

Furthermore, a liquid crystal device in accordance with another aspect of the present invention is a liquid crystal device having a first substrate and a second substrate, which are disposed to oppose each other, and liquid crystal enclosed in a gap between the first substrate and the second substrate, which comprises: a plurality of first transparent electrodes provided on the first substrate; a conductive shading film which is provided between the first transparent electrodes adjacent to each other and which is not in electrical contact with the first transparent electrodes; and wirings which are provided on the first substrate and which are connected to the transparent electrodes; wherein the wirings comprise substantially the same layer as that of the first transparent electrodes and substantially the same layer as that of the shading film. In the structure described above, since the layer used as the shading film on the first substrate is also used as the conductive layer having a lower resistance of the laminated wiring, without adding a specific step, a lower resistance of the wiring can be obtained.

In addition, a liquid crystal device in accordance with another aspect of the present invention is a liquid crystal device having a first substrate and a second substrate, which are disposed to oppose each other, and liquid crystal enclosed in a gap between the first substrate and the second substrate, which comprises: a plurality of first transparent electrodes provided on the first substrate; a conductive shading film which is provided between the first transparent electrodes adjacent to each other and which is not in electrical contact with the first transparent electrodes; a wiring provided on the first substrate; a second transparent electrode provided on the second substrate; and a conductive material connecting the wiring and the second transparent electrode; wherein the wiring comprises substantially the same layer as that of the first transparent electrodes and substantially the same layer as that of the shading film. In the structure described above, since the layer used as the shading film on the first substrate is also used as the conductive layer having a lower resistance of the laminated wiring, without adding a specific step, a lower resistance of the wiring can be obtained. In addition, the second transparent electrode provided on the second substrate is connected to the wiring provided on the first substrate by the conductive material. As a result, the connection with the external can be achieved only by connecting the first substrate therewith.

In addition, a method for manufacturing a liquid crystal device, in accordance with another aspect of the present invention, is a method for manufacturing a liquid crystal device having a first substrate and a second substrate, which are disposed to oppose each other, and liquid crystal enclosed in a gap between the first substrate and the second substrate, which comprises: a step of providing a first transparent electrode on the first substrate; a step of providing a first wiring on the second substrate; and a step of connecting the first transparent electrode and the first wiring by a conductive material; wherein the first wiring comprises a metal oxide film and a conductive film having a resistance lower than that of the metal oxide film. According to the method described above, since the first wiring is a laminated film formed of a chemically stable metal oxide film and a conductive film having a resistance lower than that thereof, compared to a single layer composed of one of the two films described above, a lower resistance of the wiring can be obtained.

Furthermore, a method for manufacturing a liquid crystal device, in accordance with another aspect of the present invention, is a method for manufacturing a liquid crystal device having a first substrate and a second substrate, which are disposed to oppose each other, and liquid crystal enclosed in a gap between the first substrate and the second substrate, which comprises: a step of providing a plurality of first transparent electrodes on the first substrate; a step of providing a conductive shading film between the first transparent electrodes adjacent to each other so as not to be in electrical contact with the first transparent electrodes; and a step of providing wirings connected to the first transparent electrodes on the first substrate; wherein the wirings are formed so as to comprise substantially the same layer as that of the first transparent electrodes and substantially the same layer as that of the shading layer. In the method described above, since the layer used as the shading film on the first substrate is also used as a conductive layer having a low resistance of the laminated wiring, without adding a specific step, a lower wiring resistance can be obtained.

In addition, a method for manufacturing a liquid crystal device, in accordance with another aspect of the present invention, is a method for manufacturing a liquid crystal device having a first substrate and a second substrate, which are disposed to oppose each other, and liquid crystal enclosed in a gap between the first substrate and the second substrate, which comprises: a step of providing a plurality of first transparent electrodes on the first substrate; a step of providing a conductive shading film between the first transparent electrodes adjacent to each other so as not to be in electrical contact with the first transparent electrodes; and a step of connecting a wiring provided on the first substrate and a second transparent electrode provided on the second substrate by a conductive material; wherein the wiring is formed so as to comprise substantially the same layer as that of the first transparent electrode and substantially the same layer as that of the shading layer. In the method described above, since the layer used as the shading film on the first substrate is also used as a conductive layer having a low resistance of the laminated wiring, without adding a specific step, a lower resistance of the wiring can be obtained, and in addition, the connection with the external can be achieved only by connecting the first substrate therewith.

BRIEF DESCRIPTION OF THE DRAWINGS

FIG. 1 is a perspective view showing an entire structure of a liquid crystal panel forming a liquid crystal display device according to the First Embodiment of the present invention.

FIG. 2 is a partial cross-sectional view showing the structure of the liquid crystal panel taken along the X direction.

FIG. 3 is a plan view showing the structure of pixels in the liquid crystal panel and the structure in the vicinity of a sealing material.

FIG. 4 is a cross-sectional view taken along the line A–A' in FIG. 3.

FIG. 5 includes (a) and (b) which are partial cross-sectional views each showing the vicinity of mounting areas of driver ICs of the liquid crystal panel.

FIG. 6 is a partial plan view showing the vicinity of a mounting area of a driver IC on a substrate at the back surface side of the liquid crystal panel.

FIG. 7 includes views showing a manufacturing process of a substrate at an observer side of the liquid crystal panel.

FIG. 8 includes views showing a manufacturing process of the substrate at the back surface side of the liquid crystal panel.

FIG. 9 includes views showing a manufacturing process of the substrate at the back surface side of the liquid crystal panel.

FIG. 10 is a perspective view showing a modified embodiment of the liquid crystal panel.

FIG. 11 is a perspective view showing another modified embodiment of the liquid crystal panel.

FIG. 12 is a partial cross-sectional view showing still another modified embodiment of the liquid crystal panel.

FIG. 13 is a partial enlarged view showing a substrate at an observer side according to an application of the liquid crystal panel.

FIG. 14 is a perspective view showing an entire structure of a liquid crystal panel forming a liquid crystal display device according to the Second Embodiment of the present invention.

FIG. 15 is a partial cross-sectional view showing the structure of the liquid crystal panel taken along the X direction.

FIG. 16 is a partial cross-sectional view showing the structure of the liquid crystal panel taken along the Y direction.

FIG. 17 is a plan view showing the structure of pixels in the liquid crystal panel and the structure in the vicinity of a sealing material.

FIG. 18 is a partial cross-sectional view showing the vicinity of a mounting area of a driver IC of the liquid crystal panel.

FIG. 19 includes views showing a manufacturing process of a substrate at the back surface side of the liquid crystal panel.

FIG. 20 includes views showing a manufacturing process of a substrate at the back surface side of the liquid crystal panel.

FIG. 21 includes views showing a manufacturing process of a substrate at the back surface side of the liquid crystal panel.

FIG. 22 is a perspective view showing a modified embodiment of the liquid crystal panel.

FIG. 23 is a perspective view showing another modified embodiment of the liquid crystal panel.

FIG. 24 is a perspective view showing the structure of a personal computer using a liquid crystal panel of an embodiment as an example of an electronic apparatus.

FIG. 25 is a perspective view showing the structure of a mobile phone using a liquid crystal panel of an embodiment as an example of an electronic apparatus.

FIG. 26 is a perspective view showing the structure of the back surface side of a digital still camera using a liquid crystal panel of an embodiment as an example of an electronic apparatus.

DETAILED DESCRIPTION OF THE PREFERRED EMBODIMENTS

Hereinafter, the embodiments of the present invention will be described with reference to drawings.

First, a liquid crystal display device according to First Embodiment of the present invention will be described. This liquid crystal display device is a transflective type which serves as a reflective display when outside light is sufficient and which serves as a transmissive display by turning on a backlight when outside light is insufficient.

FIG. 1 is a perspective view showing the structure of a liquid crystal panel of the liquid crystal display device. In this figure, in order to facilitate understanding of the structure of the liquid crystal panel, the back surface side thereof with respect to an observer is shown on the front side in the figure. In addition, FIG. 2 is a partially cross-sectional view showing the structure of the liquid crystal panel taken along the X direction in the case in which the observer side is the upper side. Accordingly, it must be kept in mind that the top and the bottom in FIGS. 1 and 2 are opposite to each other.

As shown in these figures, a liquid crystal panel 100 has a structure in which a substrate 300 located at the observer side is bonded to a substrate 200, which is located at the back surface side and which is one size smaller than the substrate 300 at the observer side, with a predetermined gap therebetween formed by a sealing material 110 containing conductive particles 114, which are also used as spacers, mixed therein, and in which, for example, TN (Twisted Nematic) type liquid crystal 160 is enclosed in the gap. In this structure, the sealing material 110 is formed on one of the substrates along the inside periphery of the substrate 200, and an opening is provided in a part of the sealing material in order to inject the liquid crystal 160 into the gap. Accordingly, after the liquid crystal is enclosed, the opening portion is encapsulated by an encapsulating material 112.

Next, on an opposing surface of the substrate (a first substrate) 200 at the back surface side, which opposes the substrate 300 at the observer side, a plurality of common (scanning) electrodes 214 is formed extending in the X (line) direction, and in addition, on an opposing surface of the substrate 300 at the observer side, which opposes the substrate 200 at the back surface side, a plurality of segment (data) electrodes 314 is formed extending in the Y (column) direction. Accordingly, in this embodiment, at the areas at which the common electrodes 214 and the segment electrodes 314 cross each other, since a voltage is applied to the liquid crystal 160 by the two electrodes, the crossing areas serve as sub-pixels.

In addition, on areas in the vicinities of the two edges of the opposing surface of the substrate (the second substrate) 300 at the observer side, which protrude from the substrate 200 at the back surface side, as described below, a driver (driving circuit) IC 122 for driving the common electrodes 214 and a driver IC 124 for driving the segment electrodes 314 are mounted, respectively, by a COG (Chip On Glass)

technique. Furthermore, to an area outside the driver IC 124 mounted on the area in the vicinity of one of the two edges described above, a FPC substrate (Flexible Printed Circuit) substrate 150 is bonded.

The common electrodes 214 formed on the substrate 200 are connected to ends of wirings (first wirings) 350 formed on the substrate 300 at the observer side via the conductive particles 114 mixed in the sealing material 110. In addition, the other ends of the wirings 350 are connected to output side bumps of the driver IC 122. That is, the driver IC 122 mounted on the substrate 300 is formed to supply common signals to the common electrodes 214 formed on the substrate 200 at the back surface side via the wirings 350, the conductive particles 114, and the common electrodes 214. In this structure, input side bumps of the driver IC 122 and the FPC substrate 150 are connected with each other by wirings (second wirings) 360.

The segment electrodes 314 formed on the substrate 300 at the observer side extend to the outside of the sealing frame and are connected to output side bumps of the driver IC 124. That is, the driver IC 124 mounted on the substrate 300 is formed to directly supply segment signals to the segment electrodes 314 formed on the same substrate 300.

In addition, input side bumps of the driver IC 124 and the FPC substrate 150 are connected with each other by wirings (second wirings) 370. That is, the FPC substrate 150 is formed to supply various signals including a power source to the driver IC 122 via the wirings 360 and to the driver IC 124 via the wirings 370.

In this connection, in the liquid crystal panel 100, as shown in FIG. 2, a polarizer 131 and a retardation film 133 are practically provided on the substrate 300 at the observer side, and in addition, a polarizer 121 and a retardation film 123 are practically provided on the substrate 200 at the back surface side (opposite side to the observer side); however, they are not shown in FIG. 1. In addition, for the substrate 200 at the back surface side, a backlight is provided so that the transmissive type is used when outside light is insufficient; however, this is not shown in FIGS. 1 and 2.

Next, details of a display area of the liquid crystal panel 100 will be described. First, the substrate 300 at the observer side will be described in detail. As shown in FIG. 2, to the external surface of the substrate 300, the retardation film 133 and the polarizer 131 are adhered. In addition, on the interior surface of the substrate 300, a plurality of strip-shaped segment electrodes 314 is formed extending in the Y direction (the direction perpendicular to the paper in the figure).

Furthermore, on the surfaces of the segment electrodes 314, an alignment film 308 composed of a polyimide or the like is formed. In this connection, the alignment film 308 is processed by a rubbing treatment in a predetermined direction before adhering to the substrate 200 at the back surface side. Since the alignment film 308 is not necessary outside the display area, this film is not provided in the vicinity of the sealing material 110 and in the outside thereof.

Subsequently, the substrate 200 at the back surface side will be described. To the exterior surface of the substrate 200, the retardation film 123 and the polarizer 121 are adhered. In addition, on the interior surface of the substrate 200, a scattering resinous layer 203 having irregularity formed thereon is formed. As described below, the scattering resinous layer 203 is formed by, for example, performing heating treatment on a photoresist having a dot pattern so as to soften the edge portions of the photoresist.

Next, on the irregular surface of the scattering resinous layer 203, a reflecting film 204 composed of a reflective metal, such as aluminum or silver, is formed. Accordingly, in conformity with the irregularity of the scattering resinous layer 203, the surface of the reflecting film 204 has irregularity, and hence, when light incident from the observer side is reflected at the reflecting film 204, the light is appropriately diffused.

In this embodiment, since the liquid crystal panel serves as a transmissive type, in the reflecting film 204, for example, two opening portions 209 in each sub-pixel for allowing light from the backlight to pass therethrough are provided (refer to FIG. 3). In this connection, without providing opening portions 209 described above, for example, by forming a film composed of a metal having light reflectivity, such as aluminum, so as to be relatively thin (20 nm to 50 nm), a structure may be formed in which a part of the incident light from the back surface side is allowed to pass therethrough.

Furthermore, on the surface of the reflecting film 204, corresponding to the areas at which the common electrodes 214 and the segment electrodes 314 cross each other, red color filters 205R, green color filters 205G, and blue color filters 205B are provided in a predetermined alignment. In this embodiment, the red color filters 205R, the green color filters 205G, and the blue color filters 205B are aligned in a stripe matrix (refer to FIG. 3) suitable for data-based display, and three sub-pixels, i.e., R (red), G (green), and B (blue), form one pixel in the form of an approximately regular tetragon; however, the present invention is not limited thereto.

Next, on the surfaces of the color filters 205R, 205G, and 205B, a planarizing film 207 composed of an insulating material is formed, whereby steps of the color filters and the irregularity of the reflecting film 204 and the like are planarized. In addition, on the flat surface of the planarization film 207 thus formed, a plurality of strip-shaped common electrodes 214 composed of a transparent conductive material, such as ITO, is formed extending in the X direction (the left to right direction in FIG. 2).

On the surfaces of the common electrodes 214, alignment film 208 composed of a polyimide or the like is formed. For the alignment film 208, a rubbing treatment is performed in a predetermined direction before the substrate at the back surface side is adhered to the substrate 300 at the observer side. In addition, since the individual color filters 205R, 205G, and 205B, the planarizing film 207, and the alignment film 208 are not necessary in area other than the display area, they are not provided in the vicinity of the sealing material 110 and the outside thereof.

Next, in the liquid crystal panel 100, the vicinity of the area at which the sealing material 110 will be described with reference to FIGS. 3 and 4 in addition to FIG. 2. FIG. 3 is a plan view of a detailed wiring structure in the vicinity of that area when viewed from the observer side to the back surface side, and FIG. 4 is a cross-sectional view taken along the line A–A'.

First, as shown in FIGS. 2 and 3, the common electrodes 214 on the substrate 200 at the back surface side are formed so as to extend to the area at which the sealing material 110 is formed, and transparent electrode films 354, which form the wirings 350, on the substrate 300 at the observer side are formed extending to the area at which the sealing material 110 is formed so as to oppose the common electrodes 214. Accordingly, when the conductive particles 114, which are also used as spacers, are dispersed in the sealing material 110 in an appropriate ratio, the common electrodes 214 and the transparent electrode films 354 are electrically connected to each other via the conductive particles 114.

As described above, the wirings 350 connect between the common electrodes 214 and the output side bumps of the driver IC 122 on the opposing surface of the substrate 300 at the observer side and more particularly, are each formed of a laminate of a low-resistance conductive film 352 and the transparent conductive film 354. In the laminate, the low-resistance conductive film 352 is a conductive layer composed of a low-resistance material (for example, chromium) having a resistance lower than that of the transparent conductive film 354, and the transparent conductive film 354 is composed of the same conductive layer as that of the segment electrode 314. Both the low-resistance conductive film 352 and the transparent conductive film 354 have been patterned so as to have an approximately equivalent shape to each other as shown in FIG. 4. However, on the area at which the sealing material 110 is formed, as shown in FIGS. 2 and 3, the low-resistance conductive film 352 is not formed, but the transparent conductive film 354 is only provided. That is, the low-resistance conductive film 352 is formed on an area other than the portion connecting with the conductive particles 114 contained in the sealing material 110.

In this connection, the diameter of the conductive particle 114 shown in FIG. 2 is larger than the actual size for ease illustration in the figure, and hence, even though it seems that one particle is provided in the width direction of the sealing material 110; however, practically, as shown in FIG. 3, a plurality of conductive particles 114 is disposed in the width direction of the sealing material 110.

Subsequently, the areas on which the driver ICs 122 and 124 are mounted and the vicinity of the area to which the FPC substrate 150 is bonded on the substrate 300 at the observer side will be described. FIG. 5(a) is a cross-sectional view showing the vicinity of the area about the wiring, to which the driver IC 122 and the FPC substrate 150 are bonded, FIG. 5(b) is a cross-sectional view showing the vicinity of the area about the wiring, to which the driver IC 124 is bonded. In addition, FIG. 6 is a plan view showing a wiring structure in the mounting area of the driver IC 122 when viewed from the back surface side through the observer side, that is, a plan view of the mounting area of the driver IC when viewed from above.

As described above, on the substrate 300 at the observer side, in addition to the segment electrodes 314, the wirings 350, 360, and 370 are provided; however, in this case, the wirings 350 and 360 connected to the driver IC 122 will be described by way of example.

First, the wirings 350 for supplying common signals from the driver IC 122 to the common electrodes 214 are each a laminated film composed of the low-resistance conductive film 352 and the transparent conductive film 354; however, as shown in FIG. 6, on the area on which the driver IC 122 is mounted, the low-resistance conductive film 352 is not provided, and the transparent electrode 354 is only formed. In other words, the low-resistance conductive film 352 is formed on an area other than the portion connecting with the driver IC 122.

The wirings 360 for supplying various signals supplied from the FPC substrate 150 to the driver IC 122, similar to the wirings 350, are each a laminated film composed of a low-resistance conductive film 362 and a transparent conductive film 364. Between these two films, the low-resistance conductive film 362 is composed of the same conductive layer as that of the low-resistance conductive film 352 of the wiring 350, and in addition, the transparent conductive film 364 is composed of the same conductive layer as that of the segment electrode 314 and the transparent conductive film 354. The low-resistance conductive film 362 and the transparent conductive film 364 are patterned so as to have the shapes approximately equivalent to each other as shown in parentheses in FIG. 4. However, in the wirings 360, on the area on which the driver IC 122 is to be mounted and on the area to which the FPC substrate 150 is to be bonded, as shown in FIGS. 5(a) and 6, the low-resistance conductive film 362 is not provided, and the transparent conductive film 364 is only formed. In other words, the low-resistance conductive film 362 is formed on area other than the portions connecting with the driver IC 122 and the FPC substrate 150.

On these wirings 350 and 360, the driver IC 122 is mounted by, for example, COG described below. First, a plurality of electrodes is provided on the periphery portion of one surface of the driver IC 122 in the rectangular parallelepiped, and bumps 129a and 129b composed of, for example, gold (Au) are formed for individual electrodes beforehand. Next, after the top to bottom relationship shown in FIG. 5 is reversed, first, an anisotropic conductive film in the form of a sheet, which is composed of an adhesive 130 such as an epoxy resin and conductive particles 134 uniformly dispersed therein, is placed on the area on which the driver IC 122 is to be mounted of the substrate 300 at the observer side; secondary, the driver IC 122 having an electrode forming surface at the bottom side thereof and the substrate 300 hold the anisotropic conductive film therebetween; and, thirdly, after aligning, the driver IC 122 is pressed and heated on the substrate 300 via the anisotropic conductive film provided therebetween.

As a result, the output side bumps 129a of the driver IC 122 for supplying common signals and the input side bumps 129b thereof for inputting signals from the FPC substrate 150 are electrically connected to the transparent electrode films 354 forming the wirings 350 and the transparent electrode films 364 forming the wirings 360, respectively, with the conductive particles 134 in the adhesive 130 therebetween. In the case described above, the adhesive 130 also serves as an sealing material protecting the electrode forming surface of the driver IC 122 from moisture, stains, stresses, and the like.

Heretofore, the wirings 350 and 360 connected to the driver IC 122 are described by way of example, and in addition, the wirings 370 for supplying various signals supplied from the FPC substrate 150 to the driver IC 124 have the same arrangement as that for the wirings 360, as shown in parentheses in FIG. 4 and FIG. 5(b). That is, similar to the wirings 360, the wirings 370 are each a laminated film composed of a low-resistance conductive film 372 and a transparent conductive film 374, the low-resistance conductive film 372 is composed of the same conductive layer as that of the low-resistance conductive films 352 and 362 of the wirings 350 and 360, and the transparent conductive film 374 is composed of the same conductive layer as that of the segment electrode 314 and the transparent conductive films 354 and 364. In addition, the low-resistance conductive film 372 and the transparent conductive film 374 are patterned so as to have the shapes approximately equivalent to each other, as shown in parentheses in FIG. 4. However, in the wirings 370, on the area on which the driver IC 124 is to be mounted and on the area to which the FPC substrate 150 is to be bonded, as shown in parentheses in FIG. 5(a) and FIG. 5(b), the low-resistance conductive film 372 is not provided, and the transparent conductive film 374 is only formed. In other words, the low-resistance conductive film 372 is formed on area other than the portions connecting with the driver IC 124 and the FPC substrate 150.

Next, similar to the driver IC 122, the driver IC 124 is connected to the segment electrodes 314 and the wirings 370 via an anisotropic conductive film. In addition, when the FPC substrate 150 is connected to the wirings 360 and 370, similarly to that described above, an anisotropic conductive film is used. As a result, in the FPC substrate 150, the wirings 154 formed on the substrate 152 composed of a polyimide or the like are electrically connected to the transparent conductive films 364 forming the wirings 360 and the transparent conductive films 374 forming the wirings 370 by conductive particles 144 in an adhesive 140.

Next, the manufacturing process for the liquid crystal display device described above will be described. First, the manufacturing process for the substrate 300 at the observer side will be described with reference to FIG. 7. In this description, the inside of the sealing frame (display area) and the sealing material will be described, respectively, mainly on the segment electrodes 314 and the wirings 350. In addition, for ease of illustration, the top to bottom relationship shown in FIG. 7 is opposite to those shown in FIGS. 2 and 5.

First, as shown in FIG. 7(a), on the entire interior surface of the substrate 300, metal (for example, chromium) having a resistance lower than that of a metal oxide having transparency, such as ITO, is deposited by sputtering or the like, thereby forming a low-resistance metal layer 352'. Next, as shown in the same figure (b), the low-resistance metal layer 352' is patterned by a photolithographic technique and an etching technique, whereby, in addition to the low-resistance conductive films 352 forming the wirings 350, the low-resistance conductive films 362 and 372 forming the wirings 360 and 370, respectively, are formed.

Next, as shown in the same figure (c), a transparent conductive layer 314' composed of ITO or the like is formed by using sputtering or an ion plating method. Subsequently, as shown in the same figure (d), the transparent conductive layer 314' is patterned by a photolithographic technique or an etching technique, whereby the segment electrodes 314 and the transparent conductive films 354 of the wirings 350 are formed. In the step described above, the transparent conductive films 362 and 372 forming the wirings 360 and 370 are simultaneously formed by patterning.

Next, after coating or printing is performed by, for example, using a polyimide solution, as shown in the same figure (e), the alignment film 308 is formed by firing. Subsequently, a rubbing treatment is performed on the alignment film 308.

Next, a manufacturing process of the substrate 200 at the back surface side will be described with reference to FIGS. 8 and 9.

First, as shown in FIG. 8(a), on the entire interior surface of the substrate 200, a negative photoresist is applied and baked, thereby forming a resinous layer 203". Next, the resinous layer 203" is exposed by using a photomask which allows a plurality of light rays to locally pass therethrough and is then developed. As a result, as shown in the same figure (b), inside the sealing frame, areas (exposed areas) exposed by the light are removed, thereby forming a plurality of projections 203a. In this connection, by using a positive photoresist, the projections 203a may be formed by curing areas exposed by light and by removing areas which are not exposed by the light.

Next, as shown in the same figure (c), the substrate 200 having the projections 203a formed thereon is processed by a heating treatment at a temperature of a heat distortion temperature of the photoresist or more. By this heating treatment, the projections 203a are softened, whereby the corner portions thereof become round. As a result, a scattering resinous layer 203 is formed having relatively smooth irregularity. In this connection, in accordance with the scattering characteristics required for the scattering resinous layer 203, a material (viscosity, film thickness, and the like) for the resinous layer 203", the shape of the projection 203a, and intervals therebetween are determined.

Furthermore, as shown in the same figure (d), a reflecting layer 204' composed of a silver alloy or aluminum is formed by sputtering or the like. Next, as shown in the same figure (e), the reflecting layer 204' is patterned by a photolithographic technique and an etching technique, thereby forming the reflecting films 204. When the patterning is performed, the opening portions 209 are simultaneously formed.

Subsequently, a resinous layer colored by one of R (red), G (green), and B (blue) is formed and is then patterned by a photolithographic technique and an etching technique, thereby forming color filters displaying one color. The color filters for the other two colors are formed by patterning in a manner similar to that described above. As a result, as shown in FIG. 9(f), on the reflecting films 204 having the opening portions 209 therein, the color filters 205R, 205G, and 205B are formed corresponding to the individual colors, R, G, and B, respectively.

Next, as shown in the same figure (g), a resinous material such as an acrylic resin is coated or printed and is then baked, thereby forming the planarizing film (overcoat) 207. The planarizing film 207 is formed so as to cover the color filters 205R, 205G, and 205B, and the reflecting films 204, and is formed so as not to extend to the area at which the sealing material 110 is to be formed.

Subsequently, on the entire interior surface of the substrate 200 provided with the planarizing film 207 formed thereon, a transparent conductive layer composed of ITO or the like is formed by sputtering, an ion plating method, or the like and is then patterned by a photolithographic technique and an etching technique, thereby forming the common electrodes 214 (refer to the same figure (h)).

Next, after coating and printing is performed by, for example, using a polyimide solution, as shown in the same figure (i), the alignment film 208 is formed by firing. Subsequently, a rubbing treatment is performed on the alignment film 208.

Even though the manufacturing process which is subsequently performed is not shown in the figure, the substrate 200 at the back surface side having the alignment film 208 processed by a rubbing treatment and the substrate 300 at the observer side having the alignment film 308 processed by a rubbing treatment are bonded together by the sealing material 110 containing the conductive particles 114 appropriately dispersed therein, and after the laminate thus formed is placed in a state approximately a vacuum, the liquid crystal 160 is dripped in the opening portion of the sealing material 110. Next, by returning the pressure to normal pressure, the liquid crystal 160 is infiltrated inside the sealing frame, and the opening portion is then encapsulated by the encapsulating material 112. Subsequently, as described above, by mounting the driver ICs 122 and 124, and the FPC substrate 150, the liquid crystal panel 100 as shown in FIG. 1 is formed.

Next, display operation for the liquid crystal display device having the structure described above will be briefly described. First, the driver IC 122 applies a selected voltage in a predetermined order to each common electrode 214 in each horizontal scanning period, and the driver IC 124 supplies each segment signal via corresponding segment electrode 314 in accordance with a display content of one line of sub-pixels located along the common electrode 214 to which the selected voltage is applied. In this step, in accordance with the difference between the voltages applied to the common electrode 214 and the segment electrode 314, the orientation state of the liquid crystal 160 at each sub-pixel in the area is controlled.

In FIG. 2, when outside light from the observer side is transmitted through the polarizer 131 and the retardation film 133, the outside light is in a predetermined polarized state, and in addition, via a path from the substrate 300 at the observer side→the segment electrode 314→the liquid crystal 160→the common electrode 214→the color filter 205, the outside light reaches the reflecting film 204, is reflected thereat, and retraces the path through which it passed. Accordingly, in the reflective type, since the orientation state of the liquid crystal 160 varies in accordance with the difference between the voltages applied to the common electrode 214 and the segment electrode 314, the amount of the outside light finally viewed by the observer, which is reflected at the reflecting film 204 and is then transmitted through the polarizer 131, is controlled for each sub-pixel.

In contrast, in the case in which a backlight (not shown) located at the back surface side of the substrate 200 is turned on, when transmitted through the polarizer 121 and the retardation film 123, the light is placed in a predetermined polarized state, and in addition, is emitted to the observer side via a path from the substrate 200 at the back surface side→the opening portions 209→the color filter 205→the common electrode 214→the liquid crystal 160→the segment electrode 314→the substrate 300 at the observer side→the polarizer 131. Accordingly, also in the transmissive type, since the orientation state of the liquid crystal 160 varies in accordance with the difference between the voltages applied to the common electrode 214 and the segment electrode 314, the amount of the light finally viewed by the observer, which is transmitted through the opening portions 209 and is then transmitted through the polarizer 131, is controlled for each sub-pixel.

As described above, according to the liquid crystal display device of this embodiment, since the reflective type is used when outside light is sufficient, and when outside light is insufficient, the transmissive type is used by turning on the backlight, both type displays can be performed.

Since the wirings 350, 360, and 370 have laminated structure of the transparent conductive films 354, 364, and 374, and low-resistance conductive films 352, 362, and 372 composed of conductive layers having a lower resistance than that mentioned above, respectively, compared to a single transparent conductive film or a single low-resistance conductive film, a lower resistance can be obtained. In particular, since the wirings 360 from the FPC substrate 150 to the input side bumps of the driver IC 122 includes a power source line of the driver IC 122 supplying common signals, a relatively high voltage is applied thereto, and in addition, the wiring distance thereof is longer compared to that of the wirings 370. As a result, when the wirings 360 have a high resistance, the influence by the voltage drop cannot be ignored. In contrast, since the wirings 360 of this embodiment are formed so as to have a low resistance, the influence by voltage drop can be reduced.

In addition, in this embodiment, the common electrodes 214 provided on the substrate 200 at the back surface side are connected to the output side of the driver IC 122 mounted on the substrate 300 at the observer side via the conductive particles 114 and the wirings 350. Accordingly, in this embodiment, even though it is a passive matrix type, bonding with the FPC substrate 150 can be performed at one position on one surface. As a result, an easier mounting step can be realized.

In addition, in the areas on which the sealing material 110 is formed and on which the driver IC 122 is mounted, the low-resistance conductive films 352 of the wirings 350 are not provided, and the transparent conductive films 354 are only provided. Furthermore, in the areas on which the driver IC 122 is mounted and to which the FPC substrate 150 is bonded, the low-resistance conductive films 362 of the wirings 360 are not provided, and the transparent conductive films 364 are only provided. In a manner similar to that described above, in the areas on which the driver IC 124 is mounted and to which the FPC substrate 150 is bonded, the low-resistance conductive films 372 of the wirings 370 are not provided, and the transparent conductive films 374 are only provided.

The reason for this is that the conductive particles 114 mixed in the sealing material 110, and the conductive particles 134 and 144 dispersed in the adhesives 130 and 140, respectively, are formed of nonconductive particles such as a plastic covered with a metal such as gold (Au), and better adhesion of the covering metal with the transparent conductive film can be obtained compared to that with the low-resistance conductive film and can also be obtained when no low-resistance conductive film is present under the transparent conductive film. That is, when wiring resistance is preferentially reduced, a structure which is formed by laminating the transparent conductive film and the low-resistance conductive film is preferable; however, in the structure mentioned above, the probability of occurrence of connection defects becomes higher in a bonding step of the substrates, a mounting step of the driver IC, and a bonding step of the FPC substrate. Accordingly, in this embodiment, at a portion to which the conductive particles are connected, the low-resistance conductive film is not provided, and the transparent conductive film is only provided.

In addition, in view of simplified structure, it may be considered that the reflecting film itself is also used as an electrode; however, the structure mentioned above is not employed in this embodiment by the reason described below. That is, since the electrodes formed on the substrate at the observer side are required to have transparency, a transparent electrode material such as ITO is used, and when the other electrodes are formed of a reflective metal which is also used as the reflecting film, the deflection of the polarity occurs when the liquid crystal is held between two different metals. Accordingly, in this embodiment, the reflecting layer is not used as the common electrode, and the common electrodes 214 are formed by patterning a transparent conductive material, such as ITO, which is also used for the segment electrodes 314.

In the First Embodiment described above, the structure is described in which the common electrodes 214 and the segment electrodes 314 are driven by the driver IC 122 and the driver IC 124, respectively; however, the present invention is not limited thereto and, for example, can be applied to a type having a one-chip driver IC formed by combining the two driver ICs as shown in FIG. 10.

In the liquid crystal display device shown in the figure, a plurality of common electrodes 214 extending in the X direction formed on the substrate 200 at the back surface side is the same as that described in the First Embodiment; however, a structure in which common electrodes 214 in the upper half extending to one side and common electrodes 214 in the bottom half extending to the other side of the substrate are connected to a driver IC 126 is a different point from that described in the First Embodiment. In this structure, the driver IC 126 is a one-chip driver IC formed by combining the driver ICs 122 and 124 in the First Embodiment, and as a result, segment electrodes 314 are also connected thereto. An FPC substrate 150 supplies various signals from an external circuit (not shown) via wirings 360 (370) for controlling the driver IC 126. In this connection, in the liquid crystal display device shown in FIG. 10, when the number of the common electrodes 214 is not enough, a structure may be formed in which the common electrodes 214 extend only to the one side.

In addition, as shown in FIG. 11, the present invention can be applied to a type having a liquid crystal panel 100 which mounts no driver IC thereon. That is, in the liquid crystal display panel shown in the figure, a driver IC 126 is mounted on an FPC substrate 150 by a flip chip technique or the like. Furthermore, by using a TAB (Tape Automated Bonding) technique, a structure may be formed in which bonding is performed by using inner leads of the driver IC 126, and bonding thereof to the liquid crystal panel 100 is performed by using outer leads. However, in the structure described above, as the number of pixels is increased, the number of connection points with the FPC substrate 150 is increased.

In addition, in the First Embodiment, the transparent 354, 364, and 374 are laminated with the low-resistance conductive films 352, 362, and 372 as the lower layers thereof, respectively; however, the present invention is not limited thereto, and as shown in FIG. 12, a structure may be formed in which a transparent conductive film 354 used as a lower layer and a low-resistance conductive layer 352 are laminated with each other. In the structure described above, a lower wiring resistance can also be obtained.

In addition, in the First Embodiment, a passive matrix type which drives liquid crystal without using switching elements is described; however, a structure may be formed which is driven by TFD (Thin Film Transistor) elements each provided in a sub-pixel (or a pixel). For example, when TFD elements are used, a display area of a substrate 300 at an observer side has a structure as shown in FIG. 13. That is, instead of the segment electrodes 314, a plurality of rectangular pixel electrodes 334 is aligned in a matrix, and the individual pixel electrodes 334 aligned in one line are connected to one data line 314*b* via the individual TFD elements 320. Since the TFD element 320 is formed of a first metal film 322/an insulating film 324 formed by anodizing the first metal film 322/a second metal film 326 when viewed from the substrate 300, that is, since a sandwiched structure of a metal/an insulating material/a metal is formed, the current-voltage characteristic thereof is nonlinear in both positive and negative directions. In addition, in this case, the individual common electrodes 214 formed on the substrate 200 at the back surface side are formed to oppose individual lines of the pixel electrodes 334 aligned in a matrix. In the structure described above, the second metal 326 can be formed of the same layer as that of the low-resistance conductive films 352, 362, and 372, and accordingly, the manufacturing process can be simplified.

In addition, in the First Embodiment, a transflective liquid crystal display device is formed; however, without providing the opening portions 209, a reflective type may be merely formed. When a reflective type is formed, instead of a backlight, a front light emitting light from the observer side may be provided when required.

Furthermore, in the embodiment, the conductance between the common electrodes 214 and the wirings 350 is formed by the conductive particles 114 mixed in the sealing material 110; however, a structure may be formed in which the conduction is obtained in an area which is separately provided outside the frame formed of the sealing material 110.

Furthermore, since the common electrodes 214 and the segment electrodes 314 have a relative relationship with each other, a structure may be formed in which common electrodes are formed on the substrate 300 at the observer side, and segment electrodes are formed on the substrate 200 at the back surface side. In the structure described above, the segment electrodes formed on the substrate 200 at the back surface side are connected to wirings 350 formed on the substrate 300 at the observer side via the conductive particles 114 contained in the sealing material 110.

In the First Embodiment described above, since the structure having the driver ICs 122 and 124 are mounted on the substrate 300 at the observer side, the wirings 350, 360, and 370 are also provided on the substrate 300 at the observer side; however, the present invention is not limited thereto, the present invention can be applied to the case in which driver ICs and wirings are provided at the back surface side.

Accordingly, next, Second Embodiment will be described in which the drivers ICs and wirings are provided on a substrate at the back surface side.

FIG. 14 is a perspective view showing an entire structure of a liquid crystal panel of the Second Embodiment. As shown in this figure, a liquid crystal panel 100 of the Second Embodiment is exactly equivalent to that in the First Embodiment (refer to FIG. 1) in appearance; however, an observer side and a back surface side are completely opposite to those in the First Embodiment. That is, in the liquid crystal panel 100 of the Second Embodiment, a substrate (first substrate) 300 is located at the back surface side, and a substrate (second substrate) 200 is located at the observer side.

In particular, as shown in FIG. 15 which is a partially exploded view of this liquid crystal panel taken along the X direction and as shown in FIG. 16 which is a partially exploded view of this liquid crystal panel taken along the Y direction, on an opposing surface of the substrate 200 at the observer side, which opposes the substrate 300 at the back surface side, a plurality of common electrodes 214 is formed extending in the X (line) direction, and on an opposing surface of the substrate 300 at the back surface side, which opposes the substrate 200 at the observer side, a plurality of segment electrodes 314 is formed extending in the Y (column) direction.

In addition, in the vicinities of two edges of the substrate 300 at the back surface side, which protrude from the substrate 200 at the observer side, a driver IC 122 for driving the common electrodes 214 and a driver IC chip 124 for driving the segment electrodes 314 are mounted by a COG technique in a manner similar to that in the First Embodiment, and in addition, between the vicinities of the two edges, to the outside of the area on which the driver IC chip 124 is mounted, an FPC substrate 150 is bonded.

In the Second Embodiment, the common electrodes 214 formed on the substrate 200 at the observer side are connected to ends of wirings 350 formed on the substrate 300 at the back surface side via conductive particles 114 mixed in a sealing material 110. In addition, the other ends of the wirings 350 are connected to output side bumps of the driver IC 122. In this connection, from the FPC substrate 150 (bonded portion) to the input side bumps of the driver chip 122, wirings 360 extend which are formed on the substrate 300.

In addition, the segment electrodes 314 formed on the substrate 300 at the back surface side are directly connected to output side bumps of the driver IC 124. Under segment electrodes 314 formed from the outside of the frame of the sealing material 110 to positions just in front of the output side bumps of the driver IC 124, low-resistance conductive films 312 of the segment electrodes 314 are formed so that the wirings 310 are formed (refer to FIG. 14 and FIG. 16). In this connection, from the FPC substrate 150 (bonded portion) to input side bumps of the driver IC chip 124, wirings 370 are formed on the substrate 300.

Next, the display area of the liquid crystal panel 100 of the Second Embodiment will be described in detail. First, the substrate 200 at the observer side will be described in detail.

As shown in FIGS. 15 and 16, to the exterior surface of the substrate 200, a retardation film 133 and a polarizer 131 are adhered. In addition, on the interior surface of the substrate 200, a plurality of strip-formed common electrodes 214, composed of a transparent conductive material such as ITO, is formed extending in the X direction (the left to right direction in FIG. 15, and the direction perpendicular to the paper in FIG. 16).

Furthermore, on the surfaces of the common electrodes 214 and the substrate 200, an alignment film 208 composed of a polyimide or the like is formed. In this connection, since the alignment film 208 is not necessary outside the display area, this film is not provided in the vicinity of the sealing material 110 and in the outside thereof.

Subsequently, the substrate 300 at the back surface side will be described. To the exterior surface of the substrate 300, a retardation film 123 and a polarizer 121 are adhered. In addition, on the interior surface of the substrate 300, a scattering resinous layer 303 having irregularity thereon is formed. The scattering resinous layer 303 is equivalent to the scanning resinous layer 203 described in the First Embodiment, and on the irregular surface, a reflecting film 304 is formed.

Accordingly, in conformity with the irregularity of the scattering resinous layer 303, the surface of the reflecting film 304 has irregularity, and hence, when light incident from the observer side is reflected at the reflecting film 304, the light is appropriately scattered.

In addition, the reflecting film 304 is formed by patterning a reflecting metal film such as aluminum or silver to have a width approximately equivalent to that of the segment electrode 314 so as to overlap therewith when viewed from above. Accordingly, segment electrodes 314 adjacent to each other are formed so that capacitive coupling therebetween via the reflecting film 304 is unlikely to occur.

Furthermore, since a liquid crystal display device according to this embodiment also serves as a transmissive type, two opening portions 309 for allowing light from a backlight to pass therethrough are formed for each sub-pixel in the reflecting film 304 when patterning is performed therefor (refer to FIG. 17).

Subsequently, on the surfaces of the reflecting films 304, corresponding to the areas at which the common electrodes 214 and the segment electrodes 314 cross with each other, red color filters 305R, green color filters 305G, and blue color filters 305B are provided in a stripe alignment, and three sub-pixels of R (red), G (green), and B (blue) form one pixel in the form of an approximately regular tetragon. However, the present invention is not limited thereto as is the case of the First Embodiment.

In addition, at the boundaries of these color filters 305R, 305G, and 305B and at the outside periphery defining the display area, a shading film 302 is provided, which are formed by patterning a shading metal layer composed of chromium or the like, so as to prevent the colors from being mixed among the sub-pixels and to serve as a frame for defining the display area.

Next, on the surfaces of the color filters 305R, 305G, and 305B, and the surface of the shading film 302, a planarizing film 307 composed of an insulating material is formed, whereby steps of the color filters, the shading film, and the like are planarized. In addition, on the flat surface of the planarizing film 307 thus obtained, a plurality of strip-shaped segment electrodes 314 composed of a transparent conductive material, such as ITO, is formed extending in the Y direction (the direction perpendicular to the paper of FIG. 15, and the right to left direction in FIG. 16). Furthermore, on the surfaces of the segment electrodes 314 and the planarizing film 307, an alignment film 308 composed of a polyimide or the like is formed. Since the alignment film 308, the planarizing film 307 thereunder, and the like are not necessary in an area other than the display area, they are not provided in the vicinity of the sealing material 110 and in the outside thereof.

As described above, in the liquid crystal panel 100 of the Second Embodiment, which differs from that of the First Embodiment, the substrate 200 is located at the observer side, and the substrate 300 is located at the back surface side. Accordingly, in the liquid crystal panel 100 of the Second Embodiment, when the vicinity of the area at which the sealing material 110 is formed is viewed from the observer side, as shown in FIG. 17, the top to bottom relationship of the common electrodes 214 and the segment electrode 314 is reversed compared to that in the First Embodiment (refer to FIG. 3). In this connection, a cross-sectional view taken along the line A–A' in FIG. 17 is in accordance with the coordinate axes shown in parentheses in FIG. 4 since the observer side and the back surface side are opposite to each other (since the z direction is reversed).

In addition, when the observer side is at the upper side, the directions of the mounting surfaces of the driver ICs 122 and 124 are reversed compared to the case in the First Embodiment (refer to FIG. 5). As a result, a plan view of the wiring structure in the mounting area of the driver IC 122 viewed from the observer side through the back surface side, that is, a plan view of the mounting area of the driver IC viewed from above, is in accordance with the coordinate axes shown in parentheses in FIG. 6, and this fact indicates that the observer side and the back surface side are opposite to each other (the z direction is reversed).

Accordingly, the arrangement of the wirings 350, 360, and 370 in the Second Embodiment is exactly equivalent to that in the First Embodiment; however, since they are provided on the back surface side, when the observer side is the upper side, the top to bottom relationship is reversed compared to that in the First Embodiment.

That is, as is the case of the First Embodiment, the wirings 350, 360, and 370 are formed by laminating low-resistance conductive films 352, 362, and 372 and transparent conductive films 354, 364, and 374 composed of the same layer as that of the segment electrode 314, respectively. However, in the Second Embodiment, the low-resistance conductive films 352, 362, and 372 are formed of the same layer as that of the shading film 302. That is, in this embodiment, by patterning a shading metal layer composed of, for example, chromium, the shading film 302 and the low-resistance conductive films 352, 362, and 372 are formed. Accordingly, next, a method for manufacturing the substrate will be described mainly on the substrate 300 at the back surface side.

For ease of illustration, the inside of the sealing frame (display area), the sealing material, and the outside of the sealing frame will be described, respectively, mainly on the segment electrodes 314 and the wirings 350.

First, as shown in FIG. 19(a), a negative photoresist is applied on the entire interior surface of the substrate 300 and is then baked, thereby forming a resinous layer 303". Next, the resinous layer 303" is exposed by using a photomask allowing a number of light rays to locally pass therethrough and is then developed. As a result, as shown in the same figure (b), in the inside of the sealing frame, areas (exposed areas) exposed by the light are removed, thereby forming a number of projections 303a. In this connection, by using a positive photoresist, the projections 303a may be formed by curing areas exposed by light and by removing areas which are not exposed by the light.

Next, as shown in the same figure (c), the substrate 300 having the projections 303a formed thereon is processed by a heating treatment at a temperature higher than a heat distortion temperature of the photoresist. By this heating treatment, the projections 303a are softened, whereby the corner portions thereof become round. As a result, a scattering resinous layer 303 is formed having relatively smooth irregularity. In this connection, in accordance with the scattering characteristics required for the scattering resinous layer 303, a material (viscosity, film thickness, and the like) for the resinous layer 303", the shape of the projection 303a, and intervals therebetween are determined.

Furthermore, as shown in the same figure (d), a reflecting layer 304' composed of a silver alloy or aluminum is formed by sputtering or the like. Next, as shown in the same figure (e), the reflecting layer 304' is patterned by a photolithographic technique and an etching technique, thereby forming the reflecting films 304. When the patterning is performed, the opening portions 309 are simultaneously formed.

Subsequently, a resinous layer colored by one of R (red), G (green), and B (blue) is formed and is then patterned by a photolithographic technique and an etching technique, thereby forming a color filter displaying one color. The color filters for the other two colors are formed by patterning in a manner similar to that described above. As a result, as shown in FIG. 20(f), on the reflecting films 304 having the opening portions 309 therein, the color filters 305R, 305G, and 305B are formed corresponding to the individual colors, R, G, and B, respectively.

Next, as shown in the same figure (g), on the entire interior surface of the substrate 300, a metal (for example, chromium) having a resistance lower than that of a metal oxide having transparency, such as ITO, is deposited by sputtering or the like, thereby forming a low-resistance metal layer 302'. Next, as shown in the same figure (h), the low-resistance metal layer 302' is patterned by a photolithographic technique and an etching technique, whereby the shading film 302 is formed in the display area which is inside the sealing frame, and outside the sealing frame, in addition to the low-resistance conductive films 352 forming the wirings 350, the low-resistance conductive films 312, 362, and 372 forming the wirings 310, 360, and 370, respectively, are formed.

Next, as shown in the same figure (i), a resinous material such as an acrylic resin is applied or printed and is then baked, thereby forming the planarizing film (overcoat) 307. The planarizing film 307 is formed so as to cover the individual color filters 305R, 305G, and 305B, and the reflecting films 307 and is not formed on the area at which the sealing material 110 is to be formed.

Subsequently, as shown in FIG. 21(j), on the entire interior surface of the substrate 300 having the planarizing film 307 formed thereon, a transparent conductive layer 314' composed of, for example, ITO is formed by sputtering or an ion plating method. Next, as shown in the same figure (k), the transparent conductive layer 314' is patterned by a photolithographic technique and an etching technique, in addition to the transparent conductive films 354 forming the wirings 350, the transparent conductive films 364 and 374 forming the wirings 360 and 370, respectively, are formed.

Subsequently, after coating or printing of, for example, a polyimide solution is performed, baking is performed, thereby forming the alignment film 308 as shown in the same figure (1). After the step described above, a rubbing treatment is performed on the alignment film 308.

Even though not shown in figures, manufacturing process for the substrate 200 at the observer side is briefly described below. That is, first, a transparent conductive layer composed of ITO or the like is formed on the entire interior surface of the substrate 200; secondary, the common electrodes 214 are formed by patterning this transparent conductive layer; and thirdly, the alignment film 208 is formed by baking after coating or printing of a polyimide solution is performed, and a rubbing treatment is then performed on the alignment film 208.

Next, the substrate 300 at the back surface side having the alignment film 308 processed by a rubbing treatment and the substrate at the observer side also having the alignment film 208 processed by a rubbing treatment are bonded together with the sealing material 110 having the conductive particles 114 appropriately dispersed therein, and after the laminate thus formed is placed in a state approximately a vacuum, the liquid crystal 160 is dripped in the opening portion of the sealing material 110. Next, by returning the pressure to normal pressure, the liquid crystal 160 is infiltrated inside the sealing frame, and the opening portion is then encapsulated by an encapsulating material 112. Subsequently, as described above, by mounting the driver ICs 122 and 124, and the FPC substrate 150, the liquid crystal panel 100 as shown in FIG. 14 is formed.

Display operation of the Second Embodiment is fundamentally equivalent to that in the First Embodiment. That is, outside light from the observer side in a reflective type is placed in a predetermined polarized state when transmitted through the polarizer 131 and the retardation film 133, and the light then reaches the reflecting film 304 via a path from the substrate 200 at the observer side→the common electrode 214→the liquid crystal 160→the segment electrode 314→the planarizing film 307→the color filter 305. Subsequently, the light is reflected at the reflecting film 304 and retraces its way through which it passed.

On the other hand, light emitted from a backlight (not shown) in a transmissive type is placed in a predetermined polarized state when transmitted through the polarizer 121 and the retardation film 123, and the light then emitted to the observer side via a path from the substrate 300 at the back surface side→the opening portions 309→the color filter 305→the planarizing film 307→the segment electrode 314→the liquid crystal 160→the common electrode 214→the substrate 200 at the observer side→the polarizer 131.

Accordingly, in the Second Embodiment, as is the case of the First Embodiment, in both the reflective type and the transmissive type, the amount of the light finally viewed by the observer is controlled for each sub-pixel.

According to the Second Embodiment described above, similar to the case of the First Embodiment, when outside light is sufficient, reflective type can be used, and when outside light is not sufficient, a transmissive type can be mainly used by turning on the backlight, whereby both display can be performed.

In the Second Embodiment, since the wirings 350, 360, and 370, which are located outside the display area, are formed by laminating the transparent conductive films 354, 364, and 374 and the low-resistance conductive films 352, 362, and 372, which are the same layer as that of the shading metal layer 302, respectively, compared to a single layer formed of one of the two films, a lower resistance can be obtained. In addition, since the segment electrodes 314 are each laminated with the low conductive film 312 outside the sealing frame, a lower resistance can be obtained.

Furthermore, since these low-resistance conductive films 312, 352, 362, and 372 are formed by patterning the same layer as that of the shading film 302 which prevents colors from being mixed and defines the frame, an additional manufacturing process is not required. As a result, in the Second Embodiment, the manufacturing process cannot be complicated, and hence, the liquid crystal device can be easily manufactured at inexpensive cost.

In addition, in the Second Embodiment, since the reflecting film 309 is patterned so as to form a strip-shaped film approximately equivalent to the shape of the segment electrodes 314, capacitive coupling therebetween via the reflecting film 304 is unlikely to occur.

In addition, in the Second Embodiment, among the segment electrodes 314 formed above the substrate 300 at the back surface side, segment electrodes from the outside of the frame of the sealing material 110 to positions just in front of the output side bumps of the driver IC 124 are provided with the low-resistance conductive films 312 thereunder (even though the distance is short) so that the wirings 310 having a laminated structure is formed, and accordingly, a lower resistance can be obtained.

According to the Second Embodiment described above, applications equivalent to those described in Embodiment can be performed. For example, as shown in FIG. 22, a structure may be formed in which the common electrodes 214 and the segment electrodes 314 are respectively driven by a one-chip driver IC 126 formed by the combination of the driver ICs 122 and 124.

In addition, without mounting a driver IC on the liquid crystal panel 100, it may be mounted on the FPC substrate 150 using a flip chip technique or a TAB technique. In this connection, FIG. 23 is a perspective view showing an example of the one-chip driver IC 126 mounted on the FPC substrate 150.

Furthermore, in the Second Embodiment, the transflective liquid crystal device is described; however, a simple reflective type may also be formed without providing the opening portions 309. When the reflective type is formed, instead of a backlight, a front light emitting light from the observer side may be provided when necessary.

In addition, in the embodiment, the conductance between the common electrodes 214 and the wirings 350 by the conductive particles 114 mixed in the sealing material 110 is described; however, a structure may be formed in which the conductance is obtained at a different place additionally formed outside the frame of the sealing material 110.

Since the common electrodes 214 and the segment electrodes 314 have a relative relationship with each other, a structure may be formed in which the segment electrodes are formed on the substrate 200 at the observer side, and the common electrodes are formed on the substrate 300 at the back surface side. In the structure described above, the segment electrodes formed on the substrate 200 at the observer side are connected to the wirings 350 formed on the substrate 300 at the back surface side via the conductive particles 114 contained in the sealing material 110.

Furthermore, in the Second Embodiment, as is the case in the First Embodiment, a structure may be formed in which each sub-pixel (or pixel) is driven by a TFD element provided therewith.

In Embodiments 1 and 2, a TN type is used as the liquid crystal; however, a bistable type having memory-type characteristics, such as a BTN (Bi-stable Twisted Nematic) type, or a ferroelectric type; a polymer dispersed type; and a GH (Guest-Host) type in which dye molecules and liquid crystal molecules are aligned in parallel by dissolving a dye having anisotropic absorption of the visible light in a long axis direction and a short axis direction in liquid crystal having predetermined molecular alignment; may also be used.

In addition, vertical orientation (homeotropic orientation) may be employed in which liquid crystal molecules are aligned in the vertical direction with respect to the two substrates when no voltage is applied to the liquid crystal, and the liquid crystal molecules are aligned in the horizontal direction with respect to the two substrates when voltage is applied thereto, and parallel (horizontal) orientation (homogeneous orientation) may also be employed in which liquid crystal molecules are aligned in the horizontal direction with respect to the two substrates when no voltage is applied to the liquid crystal, and the liquid crystal molecules are aligned in the vertical direction with respect to the two substrates when a voltage is applied thereto. As described above, the present invention can be applied to various types of liquid crystal and orientation methods.

Next, several examples of particular electronic apparatuses using the liquid crystal display devices described above will be described.

First, an example in which the liquid crystal display device of the embodiment is applied to a mobile personal computer will be described. FIG. 24 is a perspective view showing the structure of the personal computer. In the figure, a personal computer 1100 is composed of a main body portion 1104 provided with a keyboard 1102 and a liquid crystal unit 1106. The liquid crystal unit 1106 is formed by providing a backlight (not shown) on the back surface of the liquid crystal panel 100 described above. Accordingly, when outside light is sufficient, the liquid crystal panel is used as a reflective type, and when outside light is not sufficient, it is used as a transmissive type by turning on the backlight, whereby the display can be viewed.

Next, an example in which the liquid crystal display device is applied to a mobile phone will be described. FIG. 25 is a perspective view showing the structure of the mobile phone. In the figure, a mobile phone 1200 comprises, in addition to a plurality of operation buttons 1202, an earpiece 1204, a mouthpiece 1206, and the liquid crystal panel 100 described above. On the back surface of the liquid crystal panel 100, a backlight (not shown) for improving the visibility is provided when necessary.

Furthermore, a digital still camera using a liquid crystal device for a viewfinder thereof will be described. FIG. 26 is a perspective view showing the structure of this digital still camera, and in addition, briefly showing connection with external apparatuses.

Compared to a typical camera exposing a film using an optical image of the object, a digital camera 1300 produces imaging signals by performing photoelectric conversion of an optical image of the object using an imaging element such as a CCD (Charged Coupled Device). On the back surface of a case 1302 of the digital still camera 1300, the liquid crystal panel 100 is provided, and the structure is formed so as to perform display in accordance with the imaging signals from the CCD. Accordingly, the liquid crystal panel 100 serves as a viewfinder for displaying the object. In addition, on the front side (the back surface side in the figure) of the case 1302, a light-receiving unit 1304 containing an optical lens, a CCD, and the like is provided.

When a picture taker views an object image displayed on the liquid crystal panel 100 and then presses a button 1306, an imaging signal of the CCD at that time is transferred and stored in a memory of a circuit substrate 1308. In addition, in the digital still camera 1300, on the side surface of the case 1302, a video signal output terminal 1312 and an input/output terminal 1314 for data communication are provided. In addition, as shown in the figure, when it is necessary, a television monitor 1430 is connected to the former, i.e., the video signal output terminal 1312, and a personal computer 1440 is connected to the latter, i.e., the input/output terminal 1314 for data communication. Furthermore, in accordance with a predetermined operation, the imaging signal stored in the memory of the circuit substrate 1308 is output on the television monitor 1430 or to the personal computer 1440.

As an electronic apparatus, in addition to the personal computer in FIG. 24, the mobile phone in FIG. 25, and the digital still camera in FIG. 26, there may be mentioned a liquid crystal television, a viewfinder type and a direct viewing video tape recorder, a car navigation apparatus, a pager, an electronic notebook, an electronic calculator, a word processor, a workstation, a television phone, a POS terminal, an apparatus provided with a touch panel, or the like. To display portions for the various electronic apparatuses described above, the display devices described above can be naturally applied.

As described above, according to the present invention, since the resistance of the wiring provided on the substrate is formed of the laminated film of the transparent conductive film composed of the same layer as that of the transparent electrode and the low-resistance conductive layer of a material having a lower resistance than that of the transparent conductive film, compared to a single layer composed of one of the two films, a lower wiring resistance can be obtained.

What is claimed is:

1. A liquid crystal device having a first substrate, a second substrate that is opposite to the first substrate, and liquid crystal enclosed in a gap between the first substrate and the second substrate, comprising:
   a plurality of first transparent electrodes provided on the first substrate;
   a conductive shading film provided between two of the first transparent electrodes that are adjacent to each other, the conductive shading film is electrically independent of the first transparent electrodes; and
   a wiring on the first substrate, the wiring is connected to the first transparent electrodes, the wiring includes a first layer and a second layer, the first layer has at least substantially the same composition as the first transparent electrodes and the second layer has at least substantially the same composition as the shading film, the first layer is in electrical contact with the first transparent electrodes and the second layer is electrically independent of the shading film.

2. A method for manufacturing a liquid crystal device having a first substrate, a second substrate opposite to the first substrate, and liquid crystal enclosed in a gap between the first substrate and the second substrate, comprising:
   a step of providing a plurality of first transparent electrodes on the first substrate;
   a step of providing a conductive shading film between two of the first transparent electrodes that are adjacent to each other such that the shading film is electrically independent of the first transparent electrodes; and
   a step of providing wirings connected to the first transparent electrodes on the first substrate, the wirings include substantially the same composition as the first transparent electrodes and substantially the same composition as the shading film, the wirings are in electrical contact with the first transparent electrodes and are electrically independent of the shading film.

* * * * *